(12) United States Patent
Mimura

(10) Patent No.: US 12,289,093 B2
(45) Date of Patent: Apr. 29, 2025

(54) SURFACE ACOUSTIC WAVE DEVICE AND FILTER DEVICE

(71) Applicant: Murata Manufacturing Co., Ltd., Nagaokakyo (JP)

(72) Inventor: Masakazu Mimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 799 days.

(21) Appl. No.: 17/557,092

(22) Filed: Dec. 21, 2021

(65) Prior Publication Data

US 2022/0116012 A1    Apr. 14, 2022

Related U.S. Application Data

(63) Continuation of application No. PCT/JP2020/022676, filed on Jun. 9, 2020.

(30) Foreign Application Priority Data

Jun. 24, 2019  (JP) ................................ 2019-116416

(51) Int. Cl.
H03H 9/02     (2006.01)
H03H 9/145    (2006.01)
H03H 9/64     (2006.01)

(52) U.S. Cl.
CPC .... H03H 9/02559 (2013.01); H03H 9/14541 (2013.01); H03H 9/6483 (2013.01)

(58) Field of Classification Search
CPC ........... H03H 9/02559; H03H 9/14541; H03H 9/6483
See application file for complete search history.

(56) References Cited

U.S. PATENT DOCUMENTS 6,946,931 B2 *  9/2005  Inoue ................... H03H 9/6483
                                                    333/195
7,109,828 B2 *  9/2006  Takayama .............. H03H 9/145
                                                    333/195

(Continued)

FOREIGN PATENT DOCUMENTS

WO    2008/108215 A1    9/2008
WO    2008-235950 A    10/2008

(Continued)

OTHER PUBLICATIONS

Official Communication issued in International Patent Application No. PCT/JP2020/022676, mailed on Aug. 11, 2020.

*Primary Examiner* — Emily P Pham
(74) *Attorney, Agent, or Firm* — Keating & Bennett, LLP

(57) ABSTRACT

A surface acoustic wave device includes a piezoelectric substrate made of θ° rotated Y-cut X-propagation $LiNbO_3$ having a cut angle θ, an IDT electrode on the piezoelectric substrate and including a plurality of electrode fingers, and a dielectric film on the piezoelectric substrate and covering the IDT electrode. The IDT electrode includes a main electrode layer and an auxiliary conductive layer. The main electrode layer is, compared to the auxiliary conductive layer, closer to a side of the piezoelectric substrate. The main electrode layer includes Pt as a main component. Where the film thickness of the main electrode layer is denoted as h, the film thickness of the dielectric film is denoted as H, and a wavelength determined by the electrode finger pitch of the IDT electrode is denoted as λ, the relationship in Formula (1) and Equation (2A) to Equation (2D) is satisfied.

9 Claims, 14 Drawing Sheets

(56) References Cited

U.S. PATENT DOCUMENTS

| | | | |
|---|---|---|---|
| 9,035,725 B2* | 5/2015 | Komatsu | H03H 9/02858 |
| | | | 333/193 |
| 2007/0159026 A1 | 7/2007 | Kando | |
| 2009/0302709 A1 | 12/2009 | Mimura | |
| 2013/0026881 A1 | 1/2013 | Okamoto et al. | |
| 2019/0260353 A1 | 8/2019 | Daimon et al. | |
| 2019/0305751 A1 | 10/2019 | Mimura | |

FOREIGN PATENT DOCUMENTS

| | | |
|---|---|---|
| WO | 2011/158445 A1 | 12/2011 |
| WO | 2018/092470 A1 | 5/2018 |
| WO | 2018/116602 A1 | 6/2018 |

* cited by examiner

SURFACE ACOUSTIC WAVE DEVICE AND FILTER DEVICE

CROSS REFERENCE TO RELATED APPLICATIONS

This application claims the benefit of priority to Japanese Patent Application No. 2019-116416 filed on Jun. 24, 2019 and is a Continuation application of PCT Application No. PCT/JP2020/022676 filed on Jun. 9, 2020. The entire contents of each application are hereby incorporated herein by reference.

BACKGROUND OF THE INVENTION

1. Field of the Invention

The present invention relates to a surface acoustic wave device and a filter device.

2. Description of the Related Art

A surface acoustic wave device has been widely used for a filter in a cellular phone. International Publication No. 2018/092470 discloses an example of a surface acoustic wave device. The surface acoustic wave device includes a piezoelectric substrate made of $LiNbO_3$. An IDT electrode is provided on the piezoelectric substrate. In the IDT electrode, a metal film made of one of Pt, Cu, Mo, Au, W, and Ta, and a metal film made of Al are laminated. The metal film made of Al is, compared to the other metal film, positioned closer to a side of the piezoelectric substrate. The metal film made of Al is used as an auxiliary conductive layer for lowering the electric resistance of the IDT electrode.

A dielectric layer is provided on the piezoelectric substrate to cover the IDT electrode. In International Publication No. 2018/092470, the thickness of each of the metal films in the IDT electrode and the Euler angles of the piezoelectric substrate are set within predetermined ranges to increase the electromechanical coupling coefficient of a surface acoustic wave to be used and to decrease the electromechanical coupling coefficient of an unnecessary wave.

In a device using a surface acoustic wave, it has been known that electric power handling capability and linearity are likely to deteriorate when a large stress is applied to an auxiliary conductive layer such as an Al layer in an IDT electrode. In the IDT electrode having the structure described in International Publication No. 2018/092470, a stress is likely to be applied to a portion positioned on the side of the piezoelectric substrate. Accordingly, in the case that the auxiliary conductive layer is arranged on the side of the piezoelectric substrate as described above, there is a possibility that the electric power handling capability and linearity may deteriorate.

Whereas, it has been found that an unnecessary wave may not be sufficiently suppressed when a metal film made of a metal having a relatively high density, such as Pt, Cu, Mo, Au, W, or Ta, is arranged on the side of the piezoelectric substrate and the Euler angles and the film thickness of the metal film are set as disclosed as in International Publication No. 2018/092470. This is because the distance between the metal film made of a metal having a relatively high density and the piezoelectric substrate is different from the condition in International Publication No. 2018/092470.

SUMMARY OF THE INVENTION

Preferred embodiments of the present invention provide surface acoustic wave devices and filter devices that each have excellent electric power handling capability and linearity and that are each able to reduce or prevent unnecessary waves.

A surface acoustic wave device according to a preferred embodiment of the present invention includes a piezoelectric substrate made of $\theta°$ rotated Y-cut X-propagation $LiNbO_3$ having a cut angle $\theta$, an IDT electrode on the piezoelectric substrate and including a plurality of electrode fingers, and a dielectric film on the piezoelectric substrate and covering the IDT electrode. The IDT electrode includes a main electrode layer and an auxiliary conductive layer. The main electrode layer is, compared to the auxiliary conductive layer, closer to a side of the piezoelectric substrate. The main electrode layer includes Pt as a main component. Where a film thickness of the main electrode layer is denoted as h, a film thickness of the dielectric film is denoted as H, and a wavelength determined by an electrode finger pitch of the IDT electrode is denoted as $\lambda$, the relationship in Formula (1) and Equation (2A) to Equation (2D) below is satisfied:

$2 \times \exp(-A \times (\theta + 10.8)) + B \leq h/\lambda \leq 2 \times \exp(-C \times (\theta + 6.3)) + D$     Formula (1), $A = -0.1 \times (H/\lambda) + 0.265$     Equation (2A), $B = -0.2933 \times (H/\lambda)^2 + 0.0613 \times (H/\lambda) + 0.088$     Equation (2B), $C = -0.2286 \times (H/\lambda)^2 - 0.0257 \times (H/\lambda) + 0.2642$     Equation (2C), and $D = -0.5105 \times (H/\lambda)^2 + 0.1448 \times (H/\lambda) + 0.0872$     Equation (2D).

A surface acoustic wave device according to a preferred embodiment of the present invention includes a piezoelectric substrate made of $\theta°$ rotated Y-cut X-propagation $LiNbO_3$ having a cut angle $\theta$, an IDT electrode on the piezoelectric substrate and including a plurality of electrode fingers, and a dielectric film on the piezoelectric substrate and covering the IDT electrode. The IDT electrode includes a main electrode layer and an auxiliary conductive layer. The main electrode layer is, compared to the auxiliary conductive layer, closer to a side of the piezoelectric substrate. The main electrode layer includes Au as a main component. Where a film thickness of the main electrode layer is denoted as h, a film thickness of the dielectric film is denoted as H, and a wavelength determined by an electrode finger pitch of the IDT electrode is denoted as $\lambda$, the relationship in Formula (3) and Equation (4A) to Equation (4D) below is satisfied:

$2 \times \exp(-A \times (\theta + 14.6)) + B \leq h/\lambda \leq 2 \times \exp(-C \times (\theta + 9.3)) + D$     Formula (3), $A = -0.16 \times (H/\lambda)^2 - 0.0497 \times (H/\lambda) + 0.1964$     Equation (4A), $B = -0.0514 \times (H/\lambda)^2 + 0.0033 \times (H/\lambda) + 0.0692$     Equation (4B), $C = -0.12 \times (H/\lambda) + 0.249$     Equation (4C), and $D = -0.3181 \times (H/\lambda)^2 + 0.114 \times (H/\lambda) + 0.0634$     Equation (4D).

A surface acoustic wave device according to a preferred embodiment of the present invention includes a piezoelectric substrate made of $\theta°$ rotated Y-cut X-propagation $LiNbO_3$ having a cut angle $\theta$, an IDT electrode on the piezoelectric substrate and including a plurality of electrode fingers, and a dielectric film on the piezoelectric substrate and covering the IDT electrode. The IDT electrode includes a main electrode layer and an auxiliary conductive layer. The main electrode layer is, compared to the auxiliary conductive layer, closer to a side of the piezoelectric substrate. The main electrode layer includes W as a main component. Where a film thickness of the main electrode layer is denoted as h, a film thickness of the dielectric film is denoted as H, and a wavelength determined by an electrode finger pitch of the IDT electrode is denoted as λ, the relationship in Formula (5) and Equation (6A) to Equation (6D) below is satisfied:

$$2 \times \exp(-A \times (\theta+13.1)) + B \leq h/\lambda \leq 2 \times \exp(-C \times (\theta+6)) + D \quad \text{Formula (5)},$$

$$A = 1.1333 \times (H/\lambda)^2 - 0.8926 \times (H/\lambda) + 0.3466 \quad \text{Equation (6A)},$$

$$B = -1.2762 \times (H/\lambda)^2 + 0.5028 \times (H/\lambda) + 0.0798 \quad \text{Equation (6B)},$$

$$C = 3.4667 \times (H/\lambda)^2 - 2.3181 \times (H/\lambda) + 0.5858 \quad \text{Equation (6C), and}$$

$$D = -1.6 \times (H/\lambda)^2 + 0.6314 \times (H/\lambda) + 0.0884 \quad \text{Equation (6D)}.$$

A filter device according to a preferred embodiment of the present invention includes a parallel arm resonator and a resonator electrically connected to the parallel arm resonator. The parallel arm resonator is a surface acoustic wave device according to a preferred embodiment of the present invention.

According to preferred embodiments of the present invention, it is possible to provide surface acoustic wave devices and filter devices that each have excellent electric power handling capability and linearity, and that are each able to reduce or prevent unnecessary waves.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

It should be noted that the preferred embodiments described in the present description are exemplary, and partial replacement or combination of components between different preferred embodiments is possible.

Figure 1:
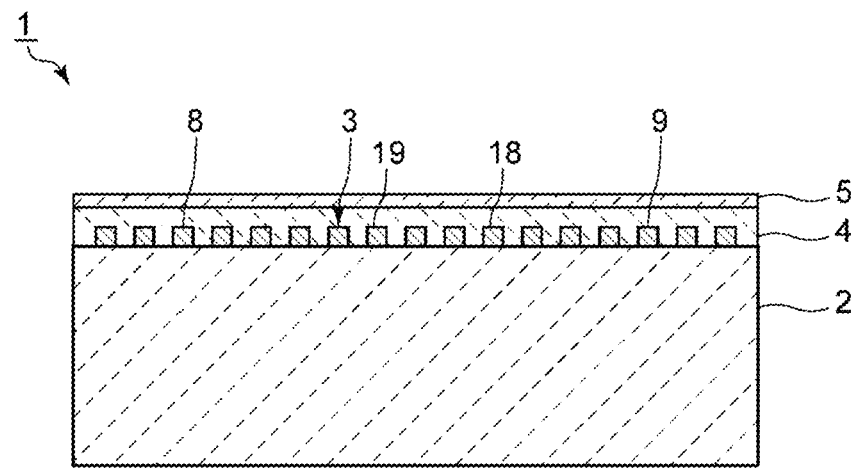
FIG. 1 is a front sectional view of a surface acoustic wave device according to a first preferred embodiment of the present invention.

FIG. 1 is a front sectional view of a surface acoustic wave device according to a first preferred embodiment of the present invention.

A surface acoustic wave device 1 includes a piezoelectric substrate 2 made of, for example, θ° rotated Y-cut X-propagation LiNbO$_3$ having a cut angle θ. An IDT electrode 3 is provided on the piezoelectric substrate 2. A surface acoustic wave is excited by applying an AC voltage to the IDT electrode 3. A pair of reflector 8 and reflector 9 are provided on both sides of the IDT electrode 3 in a propagation direction of the surface acoustic wave on the piezoelectric substrate 2. The surface acoustic wave device 1 according to the present preferred embodiment is a surface acoustic wave resonator using a Love wave as a main mode.

Figure 2:
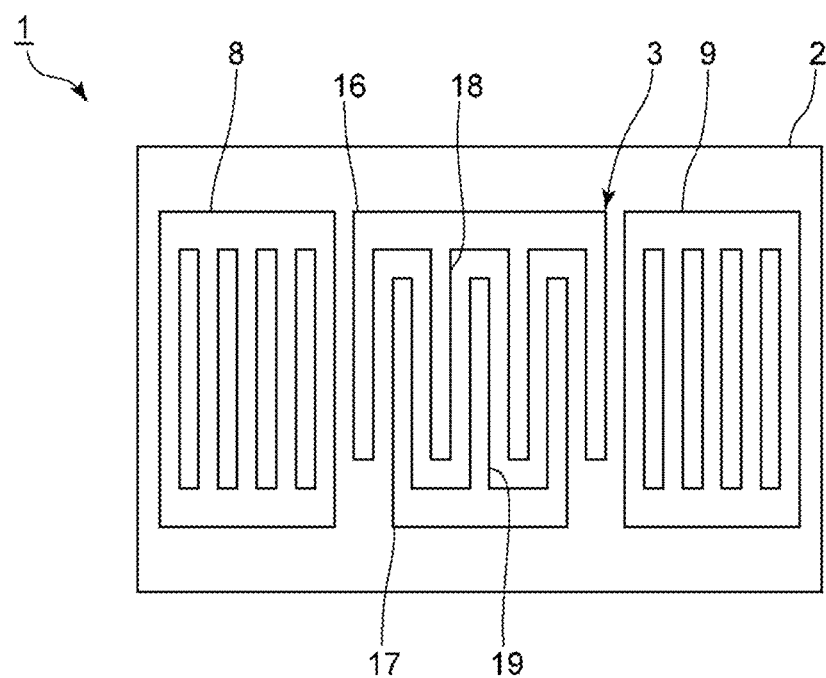
FIG. 2 is a plan view of an IDT electrode according to the first preferred embodiment of the present invention.

FIG. 2 is a plan view of an IDT electrode according to the first preferred embodiment. In FIG. 2, a dielectric film and a frequency adjustment film, which will be described later, are omitted.

The IDT electrode 3 includes a first busbar 16 and a second busbar 17 opposite to each other. The IDT electrode 3 includes a plurality of first electrode fingers 18 each with one end connected to the first busbar 16. Further, the IDT electrode 3 includes a plurality of second electrode fingers 19 each with one end connected to the second busbar 17. The plurality of first electrode fingers 18 and the plurality of second electrode fingers 19 are interdigitated with each other.

Returning to FIG. 1, a dielectric film 4 is provided on the piezoelectric substrate 2 to cover the IDT electrode 3. The dielectric film 4 is a silicon oxide film, for example. Silicon oxide is represented by SiO$_x$, where x is any positive number. The silicon oxide of the dielectric film 4 of the present preferred embodiment is SiO$_2$, for example. The material of the dielectric film 4 is not limited to the above. Whereas, the dielectric film 4 is preferably a silicon oxide film, for example. With this, the absolute value of the temperature coefficient of frequency (TCF) of the surface acoustic wave device 1 may be reduced, and the temperature characteristic of frequency may be improved.

A frequency adjustment film 5 is provided on the dielectric film 4. In the present preferred embodiment, the frequency adjustment film 5 is a silicon nitride film, for example. By adjusting the film thickness of the frequency adjustment film 5, the frequency may be easily adjusted. When the wavelength determined by the electrode finger pitch of the IDT electrode 3 is denoted as λ, the film thickness of the frequency adjustment film 5 is preferably about 0.1λ or less, for example. When the film thickness of the frequency adjustment film 5 is thick, the boundary acoustic wave is more strongly excited than the surface acoustic wave in the surface acoustic wave device 1. When the boundary acoustic wave is strongly excited, it is hard to adjust the frequency. By setting the film thickness of the frequency adjustment film 5 to about 0.1λ or less, the surface acoustic wave may be strongly excited and the frequency may be easily adjusted. The material of the frequency adjustment film 5 is not limited to the above. The frequency adjustment film 5 may not necessarily be provided.

Figure 3:
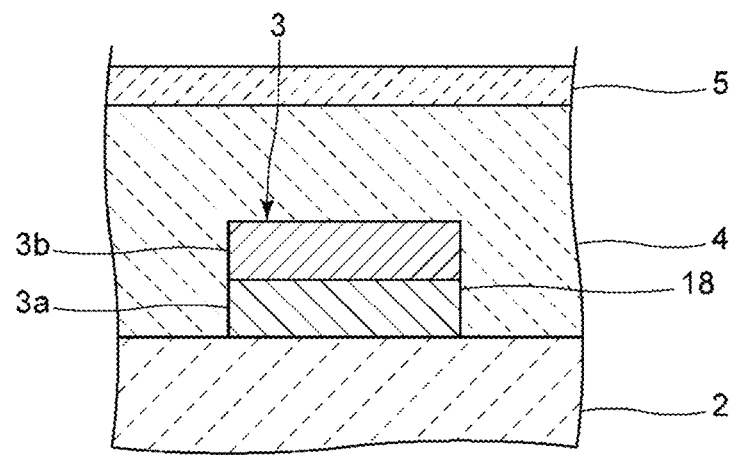
FIG. 3 is an enlarged front sectional view of an electrode finger of the IDT electrode according to the first preferred embodiment of the present invention.

FIG. 3 is an enlarged front sectional view of the electrode finger of the IDT electrode according to the first preferred embodiment.

In the present preferred embodiment, the IDT electrode 3 includes a main electrode layer 3a provided on the piezoelectric substrate 2 and an auxiliary conductive layer 3b provided on the main electrode layer 3a. In the present description, the main electrode layer is the electrode layer that is dominant in excitation of the surface acoustic wave. The auxiliary conductive layer is provided to prevent the resistance of the electrode finger from not being too small with only the main electrode layer and preferably has a higher conductivity than that of the main electrode layer.

The IDT electrode 3 may include a layer other than the main electrode layer 3a and the auxiliary conductive layer 3b. For example, an adhesive layer may be provided between the piezoelectric substrate 2 and the main electrode layer 3a, or a diffusion prevention layer may be provided between the main electrode layer 3a and the auxiliary conductive layer 3b. Alternatively, the auxiliary conductive layer may be divided into a plurality of layers, and another thin layer may be provided between the divided auxiliary conductive layers. It is sufficient that the main electrode layer 3a is, compared to the auxiliary conductive layer 3b, closer to the side of the piezoelectric substrate 2.

In the present preferred embodiment, the main electrode layer 3a includes Pt as a main component and is a Pt layer, for example. In the present description, the main component is a component including 50% by weight or more. The auxiliary conductive layer 3b includes, for example, Al as a main component. Whereas, the main component of the auxiliary conductive layer 3b is not limited to Al.

In the present preferred embodiment, a material having higher conductivity than the main electrode layer 3a is used as the material of the auxiliary conductive layer 3b. In the surface acoustic wave device according to the present preferred embodiment, the conductivity of the auxiliary conductive layer may not necessarily be higher than the conductivity of the main electrode layer. For example, it is allowed that the main electrode layer is an Au layer and the auxiliary conductive layer is an Al layer.

The present preferred embodiment has the configurations of 1) to 3). 1) The IDT electrode 3 includes the main electrode layer 3a and the auxiliary conductive layer 3b, and the main electrode layer 3a is, compared to the auxiliary conductive layer 3b, closer to the side of the piezoelectric substrate 2. 2) The main electrode layer 3a includes Pt as a main component. 3) Where the film thickness of the main electrode layer 3a is denoted as h and the film thickness of the dielectric film 4 is denoted as H, the relationship in Formula (1) and Equation (2A) to Equation (2D) below is satisfied. With this, the surface acoustic wave device 1 is excellent in electric power handling capability and linearity and is capable of suppressing unnecessary waves. This will be described below:

$$2 \times \exp(-A \times (\theta + 10.8)) + B \le h/\lambda \le 2 \times \exp(-C \times (\theta + 6.3)) + D \quad \text{Formula (1)};$$

$$A = -0.1 \times (H/\lambda) + 0.265 \quad \text{Equation (2A)};$$

$$B = -0.2933 \times (H/\lambda)^2 + 0.0613 \times (H/\lambda) + 0.088 \quad \text{Equation (2B)};$$

$$C = -0.2286 \times (H/\lambda)^2 - 0.0257 \times (H/\lambda) + 0.2642 \quad \text{Equation (2C); and}$$

$$D = -0.5105 \times (H/\lambda)^2 + 0.1448 \times (H/\lambda) + 0.0872 \quad \text{Equation (2D)}.$$

Impedance characteristics were compared by changing the lamination order of the main electrode layer and the auxiliary conductive layer in the IDT electrode. More specifically, the impedance characteristics were obtained by changing the film thickness of the main electrode layer in the configuration in which the main electrode layer was, compared to the auxiliary conductive layer, closer to the side of the piezoelectric substrate in the same or substantially the same manner as the first preferred embodiment. Whereas, as a comparative example, impedance characteristics were obtained by changing the film thickness of the main electrode layer in the configuration in which the auxiliary conductive layer was, compared to the main electrode layer, closer to the side of the piezoelectric substrate.

The design parameters of the surface acoustic wave device in which the lamination order in the IDT electrode is the same or substantially the same as that in the first preferred embodiment, and the surface acoustic wave device of the comparative example are as follows.

Piezoelectric substrate: material 10° Y-cut X-propagation LiNbO$_3$

Main electrode layer: material Pt, film thickness: varied in the range of about 0.05λ or more and about 0.14λ or less Auxiliary conductive layer: material Al, film thickness about 0.05λ

Duty ratio of IDT electrode: about 0.50

Dielectric film: material SiO$_2$, film thickness about 0.25λ

Frequency adjustment film: material SiN, film thickness about 0.01λ

Figure 4:
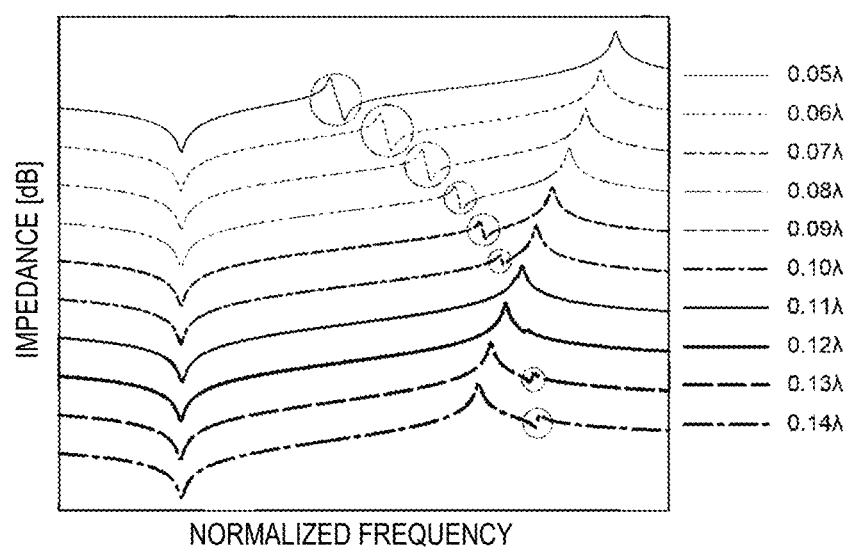
FIG. 4 is a graph of an impedance characteristic when the film thickness of a main electrode layer is varied in a surface acoustic wave device in which a lamination order in the IDT electrode is the same or substantially the same as that in the first preferred embodiment of the present invention.
Figure 5:
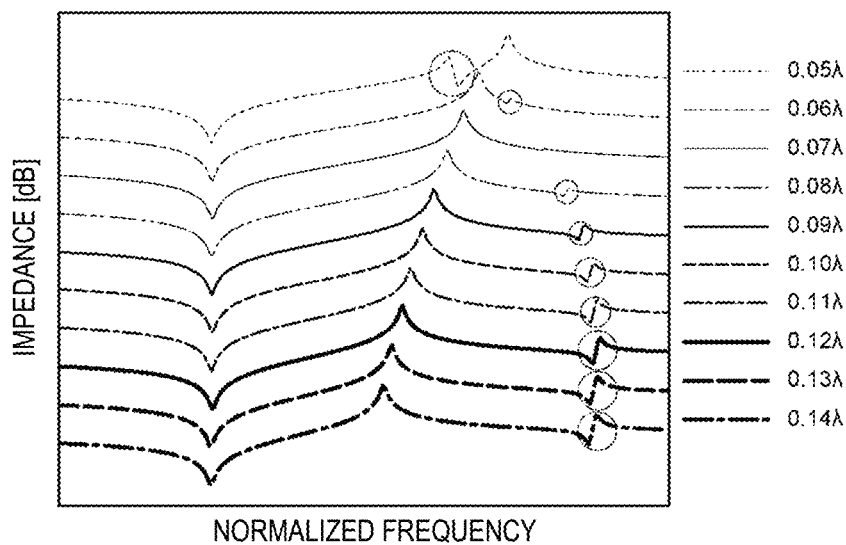
FIG. 5 is a graph of an impedance characteristic when the film thickness of a main electrode layer is varied in a surface acoustic wave device of a comparative example.

FIG. 4 is a graph of the respective impedance characteristics when the film thickness of the main electrode layer is changed in the surface acoustic wave device in which the lamination order in the IDT electrode is the same or substantially the same as that in the first preferred embodiment. FIG. 5 is a graph of the respective impedance characteristics when the film thickness of the main electrode layer is changed in the surface acoustic wave device of the comparative example.

In FIG. 4 and FIG. 5, the horizontal axis represents the normalized frequency that is normalized by the resonant frequency. Accordingly, the normalized frequency corresponding to the resonant frequency is 1 in all cases even when the film thickness of the main electrode layer is different and the resonant frequency itself is different. Thus, in FIG. 4 and FIG. 5, the position corresponding to the resonant frequency in the horizontal axis is the same or substantially the same regardless of the film thickness of the main electrode layer. Whereas, the vertical axis in FIG. 4 and FIG. 5 represents the impedance in each case that the film thickness of the main electrode layer is different. In order to facilitate observation of the difference between the impedance characteristics, the impedance characteristics are shifted in the vertical axis direction for each of the film thicknesses of the main electrode layers.

As indicated in FIG. 4 and FIG. 5, a small spurious response is observed near the anti-resonant frequency in addition to the main response. Here, the main response is due to the excitation of a Love wave and the spurious response is due to the response of a Rayleigh wave. It is observed that the magnitude of the spurious response differs depending on the film thickness of the main electrode layer.

In the case that the main electrode layer is, compared to the auxiliary conductive layer, closer to the side of the piezoelectric substrate as in the first preferred embodiment, the spurious response is particularly small when the film thickness of the main electrode layer is about 0.11, or more and about 0.12, or less, as observed in FIG. 4. Whereas, in the comparative example in which the auxiliary conductive layer is, compared to the main electrode layer, closer to the side of the piezoelectric substrate, the spurious response is particularly small when the film thickness of the main electrode layer is about 0.06, or more and about 0.07, or less, as observed in FIG. 5. As described above, it was discovered that the conditions to reduce or prevent the spurious response due to the Rayleigh wave are different depending on the lamination order of the respective layers in the IDT electrode.

Figure 6:
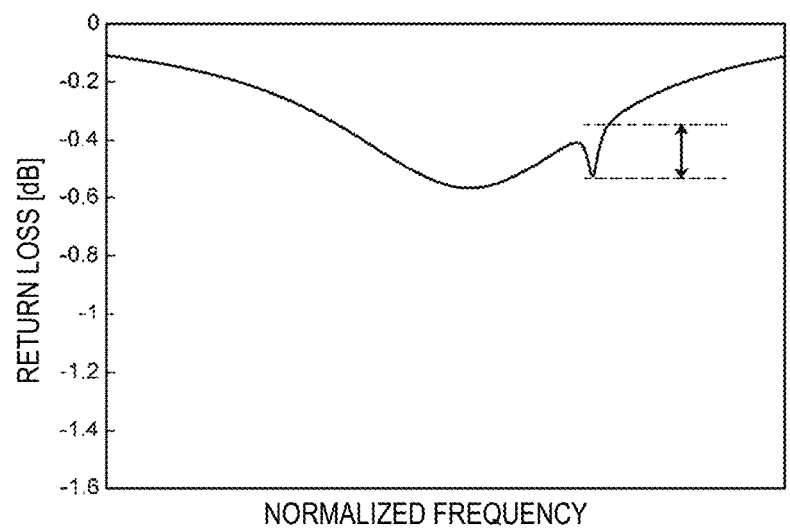
FIG. 6 is a graph of a return loss characteristic providing an example in which a spurious response occurs in a surface acoustic wave device.

Here, the magnitude of the spurious response due to the Rayleigh wave varies depending not only on the film thickness of the IDT electrode but also on the cut angle of the piezoelectric body used for the piezoelectric substrate and the film thickness of the dielectric film. Changes in the magnitude of the spurious response were studied by varying the cut angle θ of the θ° rotated Y-cut X-propagation LiNbO$_3$ used for the piezoelectric substrate, the film thickness H of the dielectric film, and/or the film thickness h of the main electrode layer in the surface acoustic wave device in which the lamination order in the IDT electrode was the same or substantially the same as in the first preferred embodiment. More specifically, the magnitude of the spurious response due to the Rayleigh wave in the return loss characteristic was studied as the example in FIG. 6. The magnitude of the spurious response is defined as the difference between the return loss at the end portion on the high frequency side and the return loss at the peak of the frequency of the ripple being the spurious response, as indicated by a double-headed arrow in FIG. 6. Changes in the magnitude of the spurious response when the cut angle θ, the film thickness H, and/or the film thickness h is varied are shown in FIG. 7 to FIG. 20.

In each of the surface acoustic wave devices for which the relationships in FIG. 7 to FIG. 20 were obtained, the film thickness of the auxiliary conductive layer is about $0.050\lambda$. The film thickness h of the main electrode layer is varied within the range in which the sum of the film thickness of the auxiliary conductive layer and the film thickness h of the main electrode layer is smaller than the film thickness H of the dielectric film. For example, when the film thickness H of the dielectric film is about $0.200\lambda$, the film thickness h of the main electrode layer is changed in the range while h<about $0.150\lambda$ is satisfied. Within the range described above, the IDT electrode is covered with the dielectric film in any case of FIG. 7 to FIG. 20.

In the surface acoustic wave devices for which the relationships in FIG. 7 to FIG. 20 are obtained, the material of the main electrode layer is Pt, the material of the auxiliary conductive layer is Al, and the material of the dielectric film is $SiO_2$, as in the case of obtaining the impedance characteristics in FIG. 4 and FIG. 5.

Figure 7:
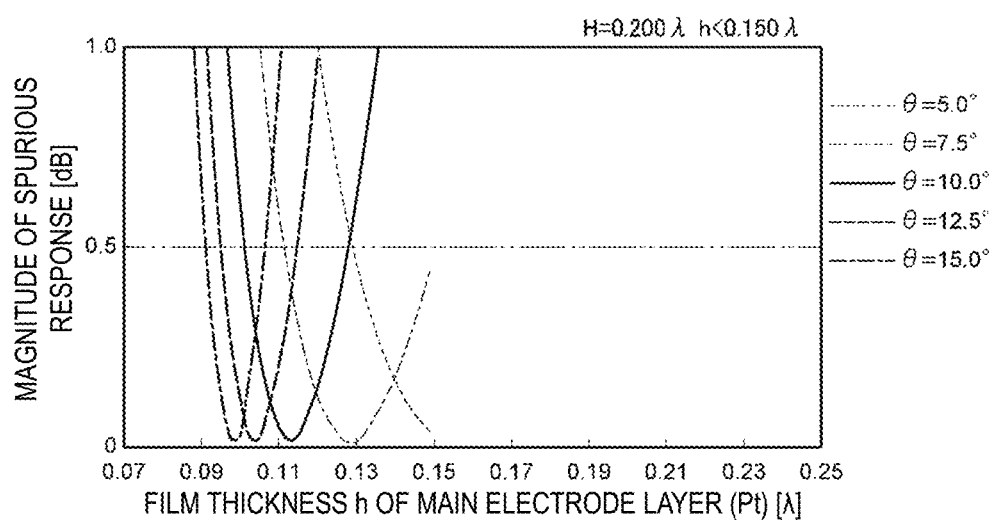
FIG. 7 is a graph of the magnitude of the spurious response when the cut angle θ of θ° rotated Y-cut X-propagation LiNbO$_3$, the film thickness H of a dielectric film, and the film thickness h of the main electrode layer are about 2.5°≤θ≤about 15°, H=about 0.200λ, and h<about 0.150λ, respectively.
Figure 8:
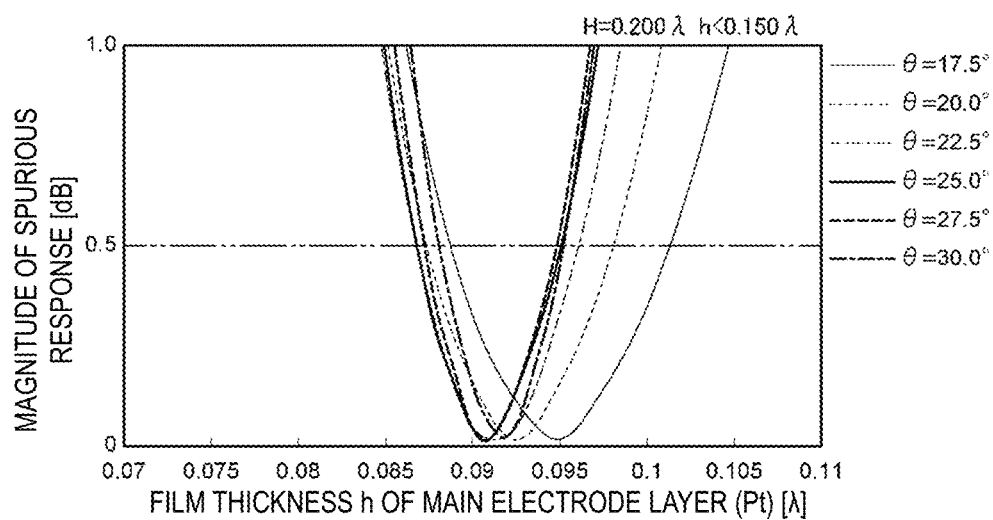
FIG. 8 is a graph of the magnitude of the spurious response when the cut angle θ of the θ° rotated Y-cut X-propagation LiNbO$_3$, the film thickness H of a dielectric film, and the film thickness h of the main electrode layer are about 17.5°≤θ≤about 30°, H=about 0.200λ, and h<about 0.150λ, respectively.
Figure 9:
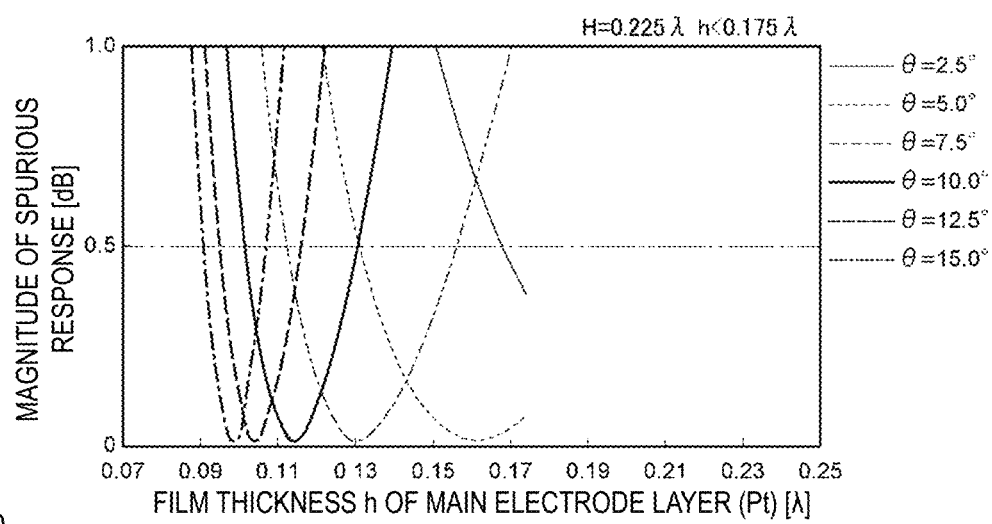
FIG. 9 is a graph of the magnitude of the spurious response when the cut angle θ of the θ° rotated Y-cut X-propagation LiNbO$_3$, the film thickness H of the dielectric film, and the film thickness h of the main electrode layer are about 2.5°≤θ≤about 15°, H=about 0.225λ, and h<about 0.175λ, respectively.
Figure 10:
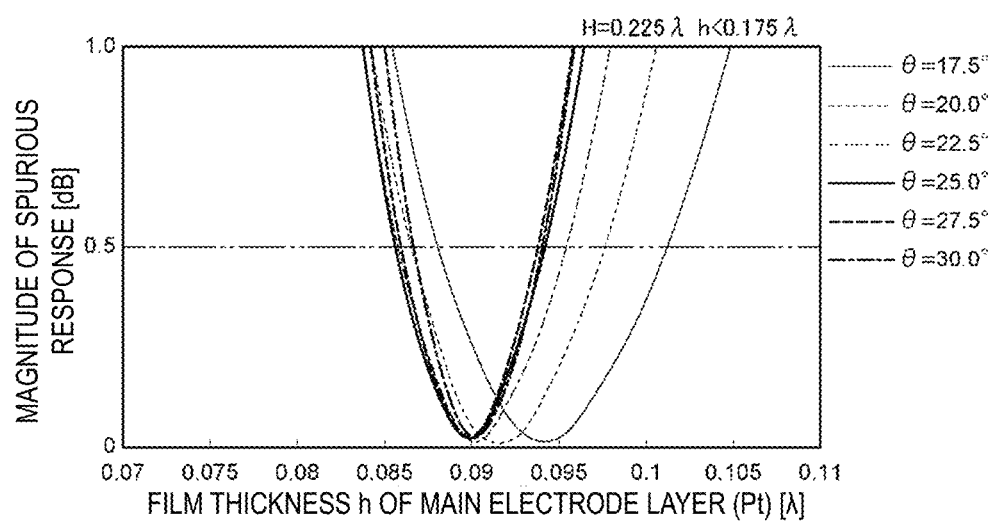
FIG. 10 is a graph of the magnitude of the spurious response when the cut angle θ of the θ° rotated Y-cut X-propagation LiNbO$_3$, the film thickness H of the dielectric film, and the film thickness h of the main electrode layer are about 17.5°≤θ≤about 30°, H=about 0.225λ, and h<about 0.175λ, respectively.
Figure 11:
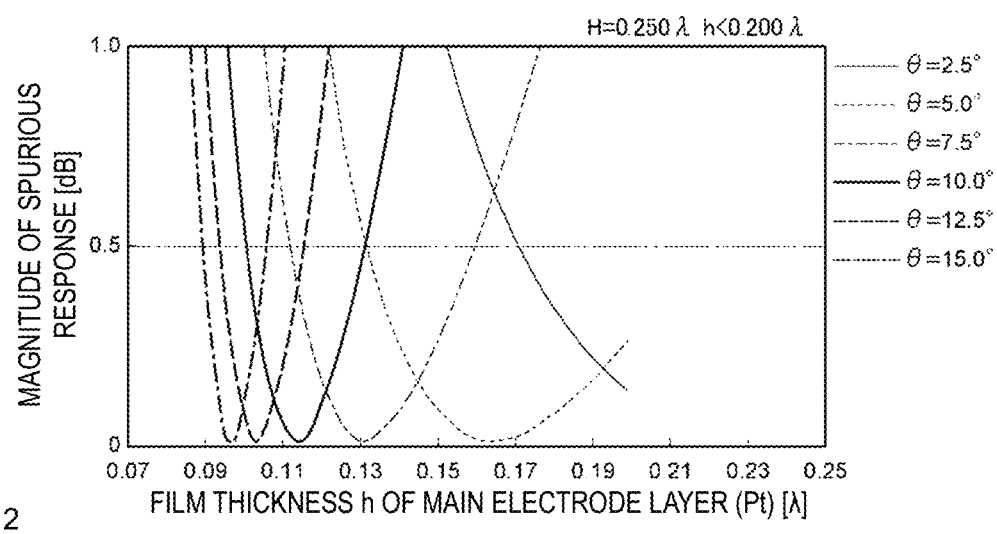
FIG. 11 is a graph of the magnitude of the spurious response when the cut angle θ of the θ° rotated Y-cut X-propagation LiNbO$_3$, the film thickness H of the dielectric film, and the film thickness h of the main electrode layer are about 2.5°≤θ≤about 15°, H=about 0.250λ, and h<about 0.200λ, respectively.
Figure 12:
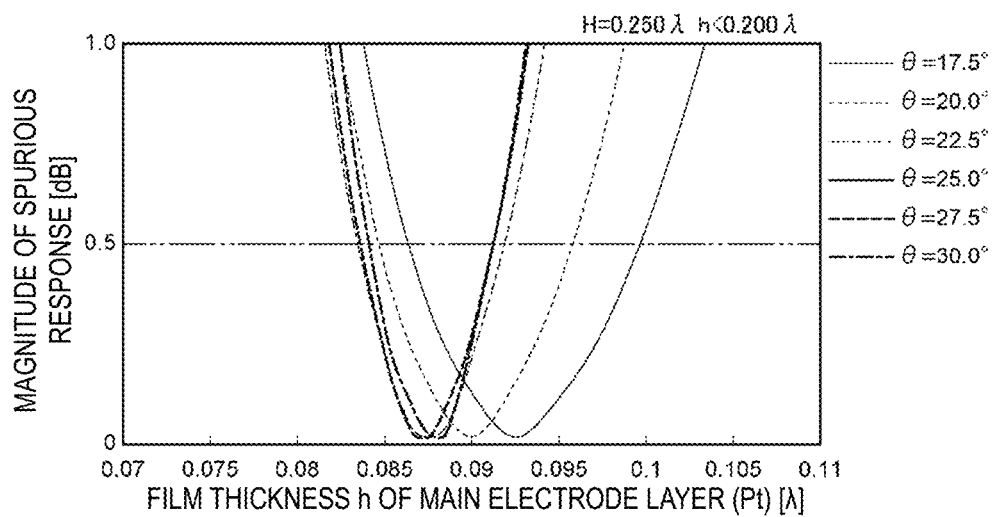
FIG. 12 is a graph of the magnitude of the spurious response when the cut angle θ of the θ° rotated Y-cut X-propagation LiNbO$_3$, the film thickness H of the dielectric film, and the film thickness h of the main electrode layer are about 17.5°≤θ≤about 30°, H=about 0.250λ, and h<about 0.200λ, respectively.
Figure 13:
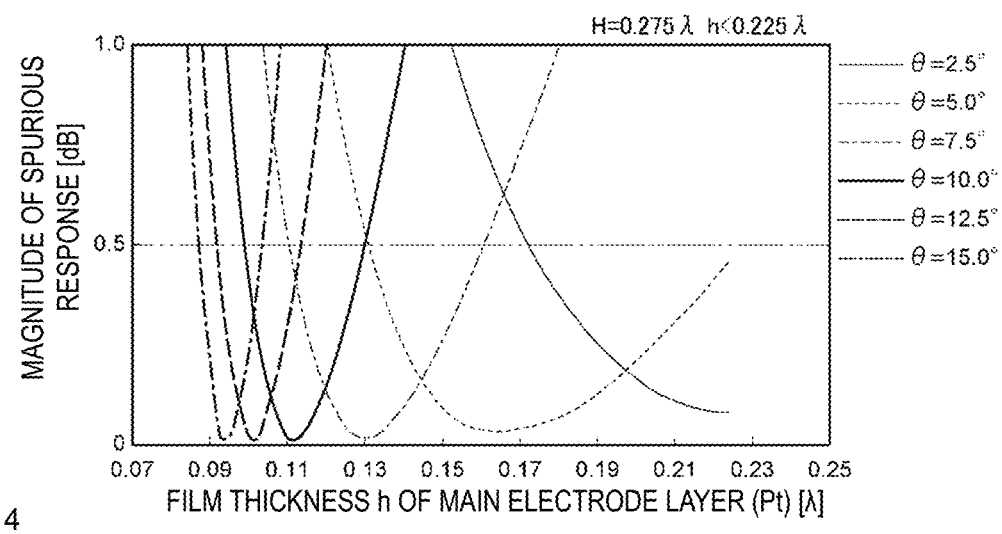
FIG. 13 is a graph of the magnitude of the spurious response when the cut angle θ of the θ° rotated Y-cut X-propagation LiNbO$_3$, the film thickness H of the dielectric film, and the film thickness h of the main electrode layer are about 2.5°≤θ≤about 15°, H=about 0.275λ, and h<about 0.225λ, respectively.
Figure 14:
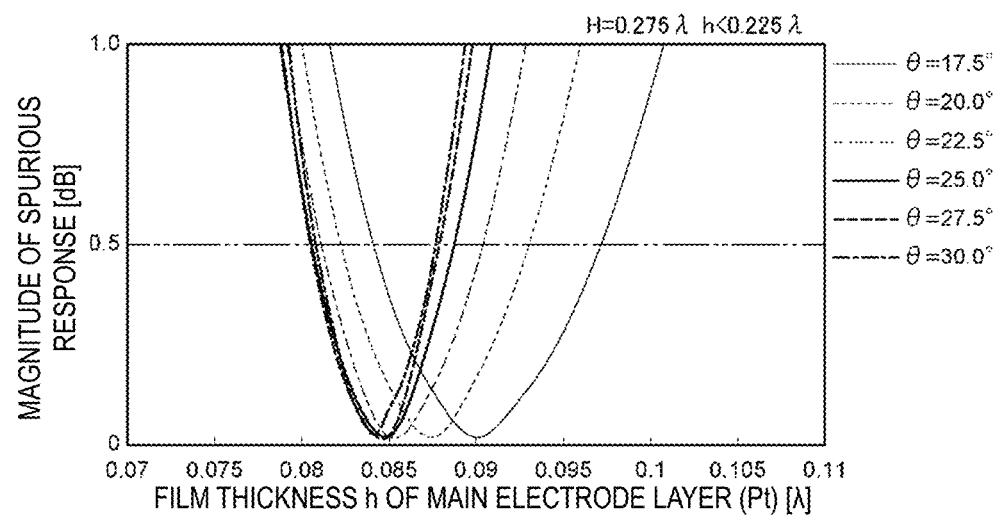
FIG. 14 is a graph of the magnitude of the spurious response when the cut angle θ of the θ° rotated Y-cut X-propagation LiNbO$_3$, the film thickness H of the dielectric film, and the film thickness h of the main electrode layer are about 17.5°≤θ≤about 30°, H=about 0.275λ, and h<about 0.225λ, respectively.
Figure 15:
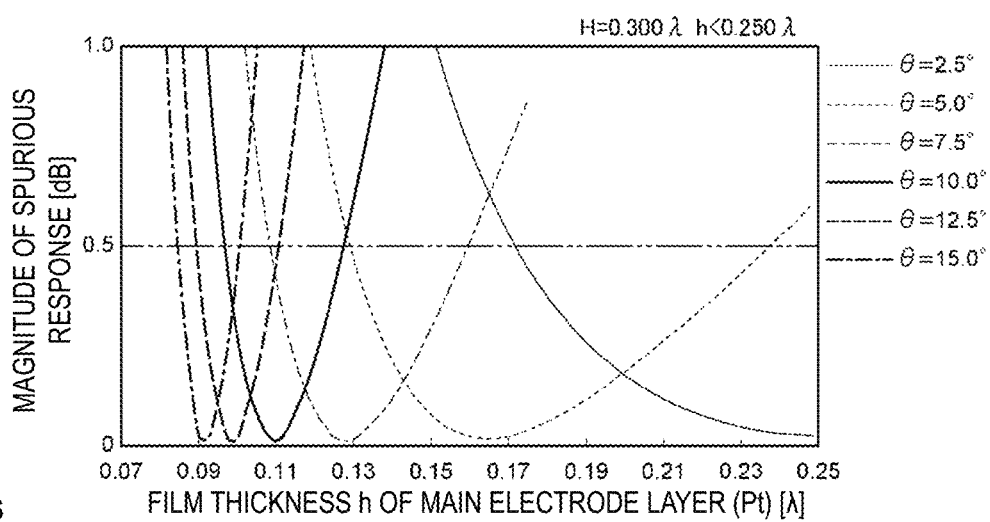
FIG. 15 is a graph of the magnitude of the spurious response when the cut angle θ of the θ° rotated Y-cut X-propagation LiNbO$_3$, the film thickness H of the dielectric film, and the film thickness h of the main electrode layer are about 2.5°≤θ≤about 15°, H=about 0.300λ, and h<about 0.250λ, respectively.
Figure 16:
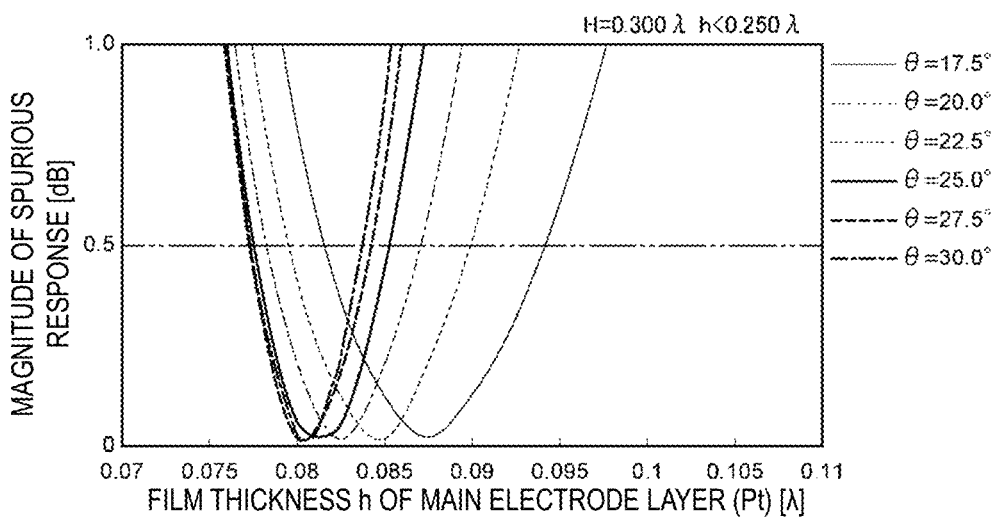
FIG. 16 is a graph of the magnitude of the spurious response when the cut angle θ of the θ° rotated Y-cut X-propagation LiNbO$_3$, the film thickness H of the dielectric film, and the film thickness h of the main electrode layer are about 17.5°≤θ≤about 30°, H=about 0.300λ, and h<about 0.250λ, respectively.
Figure 17:
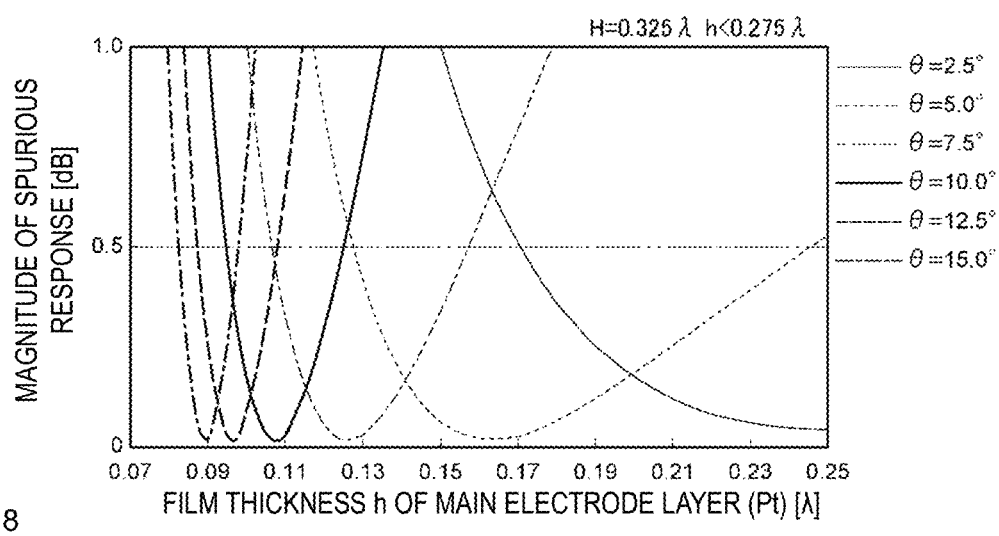
FIG. 17 is a graph of the magnitude of the spurious response when the cut angle θ of the θ° rotated Y-cut X-propagation LiNbO$_3$, the film thickness H of the dielectric film, and the film thickness h of the main electrode layer are about 2.5°≤θ≤about 15°, H=about 0.325λ, and h<about 0.275λ, respectively.
Figure 18:
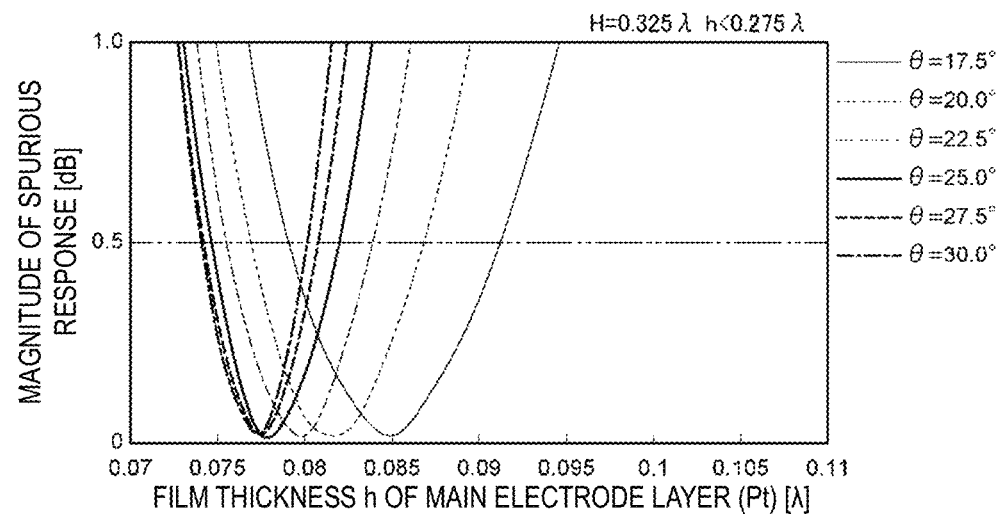
FIG. 18 is a graph of the magnitude of the spurious response when the cut angle θ of the θ° rotated Y-cut X-propagation LiNbO$_3$, the film thickness H of the dielectric film, and the film thickness h of the main electrode layer are about 17.5°≤θ≤about 30°, H=about 0.325λ, and h<about 0.275λ, respectively.
Figure 19:
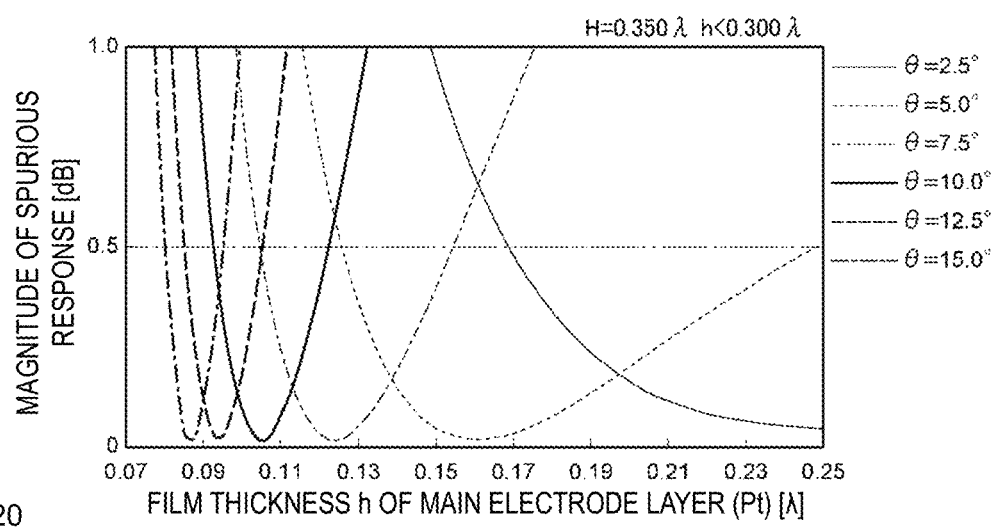
FIG. 19 is a graph of the magnitude of the spurious response when the cut angle θ of the θ° rotated Y-cut X-propagation LiNbO$_3$, the film thickness H of the dielectric film, and the film thickness h of the main electrode layer are about 2.5°≤θ≤about 15°, H=about 0.350λ, and h<about 0.300λ, respectively.
Figure 20:
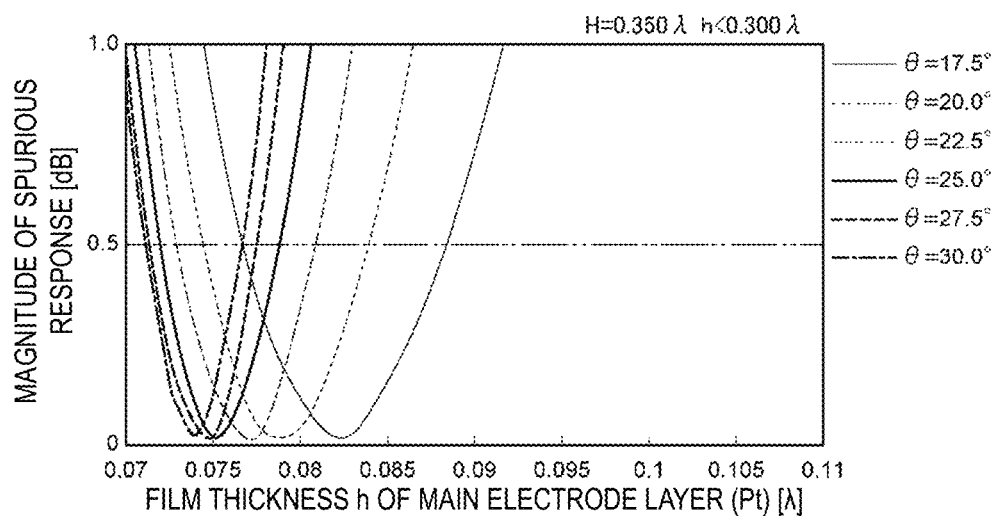
FIG. 20 is a graph of the magnitude of the spurious response when the cut angle θ of the θ° rotated Y-cut X-propagation LiNbO$_3$, the film thickness H of the dielectric film, and the film thickness h of the main electrode layer are about 17.5°≤θ≤about 30°, H=about 0.350λ, and h<about 0.300λ, respectively.

FIG. 7 is a graph of the magnitude of the spurious response when the cut angle θ of the 0° rotated Y-cut X-propagation $LiNbO_3$, the film thickness H of the dielectric film, and the film thickness h of the main electrode layer satisfy about $2.5° \leq \theta \leq $ about $15°$, H=about $0.200\lambda$, and h<about $0.150\lambda$, respectively. There is no line of θ=about 2.5° in FIG. 7 because the magnitude of the spurious response is not about 0.5 dB or less in the following range when θ is about 2.5°. The sum of the film thickness of the auxiliary conductive layer and the film thickness h of the main electrode layer is smaller than the thickness H of the dielectric film. FIG. 8 is a graph of the magnitude of the spurious response when the cut angle θ of the 0° rotated Y-cut X-propagation $LiNbO_3$, the film thickness H of the dielectric film, and the film thickness h of the main electrode layer satisfy about $17.5° \leq \theta \leq $ about $30°$, H=about $0.200\lambda$, and h<about $0.150\lambda$, respectively. FIG. 9 is a graph of the magnitude of the spurious response when the cut angle θ of the 0° rotated Y-cut X-propagation $LiNbO_3$, the film thickness H of the dielectric film, and the film thickness h of the main electrode layer satisfy about $2.5° \leq \theta \leq $ about $15°$, H=about $0.225\lambda$, and h<about $0.175\lambda$, respectively. FIG. 10 is a graph of the magnitude of the spurious response when the cut angle θ of the 0° rotated Y-cut X-propagation $LiNbO_3$, the film thickness H of the dielectric film, and the film thickness h of the main electrode layer satisfy about $17.5° \leq \theta \leq $ about $30°$, H=about $0.225\lambda$, and h<about $0.175\lambda$, respectively. FIG. 11 is a graph of the magnitude of the spurious response when the cut angle θ of the 0° rotated Y-cut X-propagation $LiNbO_3$, the film thickness H of the dielectric film, and the film thickness h of the main electrode layer satisfy about $2.5° \leq \theta \leq $ about $15°$, H=about $0.250\lambda$, and h<about $0.200\lambda$, respectively. FIG. 12 is a graph of the magnitude of the spurious response when the cut angle θ of the 0° rotated Y-cut X-propagation $LiNbO_3$, the film thickness H of the dielectric film, and the film thickness h of the main electrode layer satisfy about $17.5° \leq \theta \leq $ about $30°$, H=about $0.250\lambda$, and h<about $0.200\lambda$, respectively. FIG. 13 is a graph of the magnitude of the spurious response when the cut angle θ of the 0° rotated Y-cut X-propagation $LiNbO_3$, the film thickness H of the dielectric film, and the film thickness h of the main electrode layer satisfy about $2.5° \leq \theta \leq $ about $15°$, H=about $0.275\lambda$, and h<about $0.225\lambda$, respectively. FIG. 14 is a graph of the magnitude of the spurious response when the cut angle θ of the 0° rotated Y-cut X-propagation $LiNbO_3$, the film thickness H of the dielectric film, and the film thickness h of the main electrode layer satisfy about $17.5° \leq \theta \leq $ about $30°$, H=about $0.275\lambda$, and h<about $0.225\lambda$, respectively. FIG. 15 is a graph of the magnitude of the spurious response when the cut angle θ of the 0° rotated Y-cut X-propagation $LiNbO_3$, the film thickness H of the dielectric film, and the film thickness h of the main electrode layer satisfy about $2.5° \leq \theta \leq $ about $15°$, H=about $0.300\lambda$, and h<about $0.250\lambda$, respectively. FIG. 16 is a graph of the magnitude of the spurious response when the cut angle θ of the 0° rotated Y-cut X-propagation $LiNbO_3$, the film thickness H of the dielectric film, and the film thickness h of the main electrode layer satisfy about $17.5° \leq \theta \leq $ about $30°$, H=about $0.300\lambda$, and h<about $0.250\lambda$, respectively. FIG. 17 is a graph of the magnitude of the spurious response when the cut angle θ of the 0° rotated Y-cut X-propagation $LiNbO_3$, the film thickness H of the dielectric film, and the film thickness h of the main electrode layer satisfy about $2.5° \leq \theta \leq $ about $15°$, H=about $0.325\lambda$, and h<about $0.275\lambda$, respectively. FIG. 18 is a graph of the magnitude of the spurious response when the cut angle θ of the 0° rotated Y-cut X-propagation $LiNbO_3$, the film thickness H of the dielectric film, and the film thickness h of the main electrode layer satisfy about $17.5° \leq \theta \leq $ about $30°$, H=about $0.325\lambda$, and h<about $0.275\lambda$, respectively. FIG. 19 is a graph of the magnitude of the spurious response when the cut angle θ of the 0° rotated Y-cut X-propagation $LiNbO_3$, the film thickness H of the dielectric film, and the film thickness h of the main electrode layer satisfy about $2.5° \leq \theta \leq $ about $15°$, H=about $0.350\lambda$, and h<about $0.300\lambda$, respectively. FIG. 20 is a graph of the magnitude of the spurious response when the cut angle θ of the 0° rotated Y-cut X-propagation $LiNbO_3$, the film thickness H of the dielectric film, and the film thickness h of the main electrode layer satisfy about $17.5° \leq \theta \leq $ about $30°$, H=about $0.350\lambda$, and h<about $0.300\lambda$, respectively.

As shown by the thin broken line in FIG. 7, in a case that the cut angle θ of the 0° rotated Y-cut X-propagation $LiNbO_3$ is about 5.0°, the spurious response is about 0.5 dB or less when the film thickness h of the main electrode layer satisfies about $0.1291\lambda \leq h$, such that the spurious response is effectively reduced or prevented. As described above, the condition implies that the film thickness of the IDT electrode is less than the film thickness H of the dielectric film. Accordingly, in the case illustrated in FIG. 7, the film thickness H of the dielectric film satisfies H=about $0.200\lambda$, the film thickness of the auxiliary conductive layer is about $0.050\lambda$, and the film thickness h of the main electrode layer satisfies h<about $0.150\lambda$. Thus, under the condition described above, when θ is about 5.0°, the magnitude of the spurious response is about 0.5 dB or less in the case where about $0.1291\lambda \leq h <$ about $0.150\lambda$ is satisfied.

Similarly, when the cut angle θ is about 7.5°, about 10.0°, about 12.5°, or about 15.0°, the range of the film thickness h of the main electrode layer in which the magnitude of the spurious response is about 0.5 dB or less is as follows. The range of the film thickness h of the main electrode layer is about $0.1114\lambda \leq h <$ about $0.150\lambda$, when θ=about 7.5°, about $0.1012\lambda$ h about $0.128\lambda$, when θ=about 10.0°, about $0.095\lambda$ h about $0.1147\lambda$, when θ=about 12.5°, and about $0.0911\lambda$ h about $0.1065\lambda$, when θ=about 15.0°. As described above, in the case that the film thickness H of the dielectric film is about $0.200\lambda$, the spurious response may be effectively reduced or prevented by setting the film thickness h of the main electrode layer within the above-described range depending on the cut angle θ.

In FIG. 8, shown is the range of the film thickness h of the main electrode layer in which the spurious response may be suppressed under the following condition. The film thickness H of the dielectric film is about 0.200λ, and the cut angle θ is about 17.5°, about 20.0°, about 22.5°, about 25.0°, about 27.5°, or about 30.0°. In FIG. 9 to FIG. 20, shown is the range of the film thickness h of the main electrode layer in which the spurious response may be reduced or prevented for each cut angle θ under the following condition. The film thickness H of the dielectric film is about 0.225λ, about 0.250λ, about 0.275λ, about 0.300λ, about 0.325λ, or about 0.350λ. Conditions obtained from FIG. 7 to FIG. 20, under which the spurious response may be reduced or prevented, are listed in Table 1. In Table 1, the value of the film thickness h with which the magnitude of the spurious response is about 0.5 dB is described as the minimum value or the maximum value. Accordingly, when the maximum value is not described in Table 1, the upper limit of the film thickness h with which the magnitude of the spurious response is about 0.5 dB or less equals the upper limit which the film thickness h may take in each film thickness H. For example, when H=about 0.200λ and θ=about 5.0°, the maximum value of the film thickness h is not described in Table 1, but the magnitude of the spurious response is about 0.5 dB or less when h<about 0.15λ is satisfied.

TABLE 1

| FILM THICKNESS H OF DIELECTRIC FILM ($SiO_2$) | θ | RANGE OF FILM THICKNESS h OF MAIN ELECTRODE LAYER (Pt) |
|---|---|---|
| 0.200λ | 5 | $0.1291 \leq h/\lambda$ |
| | 7.5 | $0.1114 \leq h/\lambda$ |
| | 10 | $0.1012 \leq h/\lambda \leq 0.128$ |
| | 12.5 | $0.095 \leq h/\lambda \leq 0.1147$ |
| | 15 | $0.0911 \leq h/\lambda \leq 0.1065$ |
| | 17.5 | $0.0887 \leq h/\lambda \leq 0.1013$ |
| | 20 | $0.0873 \leq h/\lambda \leq 0.0981$ |
| | 22.5 | $0.0868 \leq h/\lambda \leq 0.0961$ |
| | 25 | $0.0868 \leq h/\lambda \leq 0.0951$ |
| | 27.5 | $0.0872 \leq h/\lambda \leq 0.0948$ |
| | 30 | $0.088 \leq h/\lambda \leq 0.0952$ |
| 0.225λ | 2.5 | $0.1678 \leq h/\lambda$ |
| | 5 | $0.1309 \leq h/\lambda$ |
| | 7.5 | $0.1122 \leq h/\lambda \leq 0.1561$ |
| | 10 | $0.1014 \leq h/\lambda \leq 0.1305$ |
| | 12.5 | $0.0948 \leq h/\lambda \leq 0.1159$ |
| | 15 | $0.0906 \leq h/\lambda \leq 0.1069$ |
| | 17.5 | $0.088 \leq h/\lambda \leq 0.1012$ |
| | 20 | $0.0866 \leq h/\lambda \leq 0.0977$ |
| | 22.5 | $0.0857 \leq h/\lambda \leq 0.0954$ |
| | 25 | $0.0856 \leq h/\lambda \leq 0.0942$ |
| | 27.5 | $0.0859 \leq h/\lambda \leq 0.0938$ |
| | 30 | $0.0866 \leq h/\lambda \leq 0.0941$ |
| 0.250λ | 2.5 | $0.1707 \leq h/\lambda$ |
| | 5 | $0.1314 \leq h/\lambda$ |
| | 7.5 | $0.1117 \leq h/\lambda \leq 0.1595$ |
| | 10 | $0.1005 \leq h/\lambda \leq 0.131$ |
| | 12.5 | $0.0935 \leq h/\lambda \leq 0.1153$ |
| | 15 | $0.0892 \leq h/\lambda \leq 0.1057$ |
| | 17.5 | $0.0863 \leq h/\lambda \leq 0.0997$ |
| | 20 | $0.0846 \leq h/\lambda \leq 0.0958$ |
| | 22.5 | $0.0837 \leq h/\lambda \leq 0.0933$ |
| | 25 | $0.0834 \leq h/\lambda \leq 0.0919$ |
| | 27.5 | $0.0835 \leq h/\lambda \leq 0.0913$ |
| | 30 | $0.0841 \leq h/\lambda \leq 0.0913$ |
| 0.275λ | 2.5 | $0.1721 \leq h/\lambda$ |
| | 5 | $0.1308 \leq h/\lambda$ |
| | 7.5 | $0.1104 \leq h/\lambda \leq 0.1608$ |
| | 10 | $0.0988 \leq h/\lambda \leq 0.1299$ |
| | 12.5 | $0.0917 \leq h/\lambda \leq 0.1134$ |
| | 15 | $0.0871 \leq h/\lambda \leq 0.1034$ |
| | 17.5 | $0.0841 \leq h/\lambda \leq 0.0972$ |
| | 20 | $0.0822 \leq h/\lambda \leq 0.093$ |
| | 22.5 | $0.0811 \leq h/\lambda \leq 0.0904$ |
| | 25 | $0.0805 \leq h/\lambda \leq 0.0887$ |
| | 27.5 | $0.0805 \leq h/\lambda \leq 0.0879$ |
| | 30 | $0.0807 \leq h/\lambda \leq 0.0877$ |
| 0.300λ | 2.5 | $0.171857 \leq h/\lambda$ |
| | 5 | $0.1293 \leq h/\lambda \leq 0.237917$ |
| | 7.5 | $0.108547 \leq h/\lambda \leq 0.159785$ |
| | 10 | $0.096744 \leq h/\lambda \leq 0.127627$ |
| | 12.5 | $0.089417 \leq h/\lambda \leq 0.110767$ |
| | 15 | $0.084677 \leq h/\lambda \leq 0.100656$ |
| | 17.5 | $0.081561 \leq h/\lambda \leq 0.094225$ |
| | 20 | $0.0795 \leq h/\lambda \leq 0.089909$ |
| | 22.5 | $0.078295 \leq h/\lambda \leq 0.087082$ |
| | 25 | $0.077432 \leq h/\lambda \leq 0.0853$ |
| | 27.5 | $0.0773 \leq h/\lambda \leq 0.084261$ |
| | 30 | $0.0773 \leq h/\lambda \leq 0.083857$ |
| 0.325λ | 2.5 | $0.170645 \leq h/\lambda$ |
| | 5 | $0.12743 \leq h/\lambda \leq 0.2457$ |
| | 7.5 | $0.106503 \leq h/\lambda \leq 0.157298$ |
| | 10 | $0.09458 \leq h/\lambda \leq 0.124948$ |
| | 12.5 | $0.087125 \leq h/\lambda \leq 0.107961$ |
| | 15 | $0.0823 \leq h/\lambda \leq 0.097764$ |
| | 17.5 | $0.079045 \leq h/\lambda \leq 0.091226$ |
| | 20 | $0.077 \leq h/\lambda \leq 0.08679$ |
| | 22.5 | $0.075534 \leq h/\lambda \leq 0.083872$ |
| | 25 | $0.0746 \leq h/\lambda \leq 0.081959$ |
| | 27.5 | $0.074146 \leq h/\lambda \leq 0.0807$ |
| | 30 | $0.074025 \leq h/\lambda \leq 0.080125$ |
| 0.350λ | 2.5 | $0.168721 \leq h/\lambda$ |
| | 5 | $0.125626 \leq h/\lambda \leq 0.2486$ |
| | 7.5 | $0.104545 \leq h/\lambda \leq 0.154459$ |
| | 10 | $0.092512 \leq h/\lambda \leq 0.122254$ |
| | 12.5 | $0.084951 \leq h/\lambda \leq 0.105254$ |
| | 15 | $0.080114 \leq h/\lambda \leq 0.095026$ |
| | 17.5 | $0.076659 \leq h/\lambda \leq 0.088373$ |
| | 20 | $0.074356 \leq h/\lambda \leq 0.0839$ |
| | 22.5 | $0.072927 \leq h/\lambda \leq 0.080872$ |
| | 25 | $0.0719 \leq h/\lambda \leq 0.078818$ |
| | 27.5 | $0.0714 \leq h/\lambda \leq 0.077496$ |
| | 30 | $0.0713 \leq h/\lambda \leq 0.076696$ |

Figure 21:
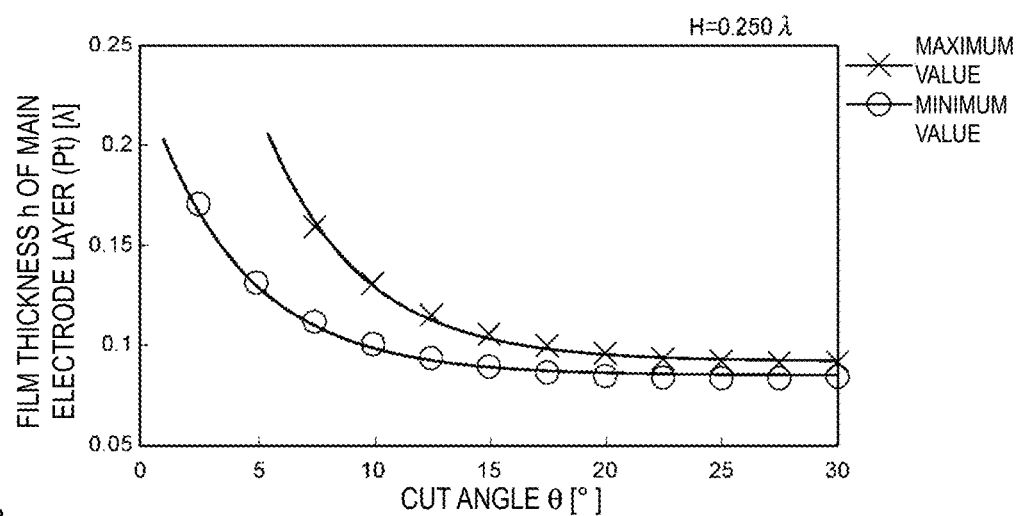
FIG. 21 is a graph of the relationship between the maximum/minimum values of the film thickness h of the main electrode layer and the cut angle θ in which the magnitude of the spurious response is about 0.5 dB or less, when the film thickness H of the dielectric film is about 0.250λ.

As described in Table 1, when the film thickness H of the dielectric film is constant, the range of the film thickness h of the main electrode layer in which the magnitude of the spurious response is about 0.5 dB or less varies depending on the cut angle θ. In FIG. 21, shown is an example of the relationship between the maximum/minimum values of the film thickness h of the main electrode layer and the cut angle θ in which the magnitude of the spurious response is about 0.5 dB or less.

FIG. 21 is a graph of the relationship between the maximum/minimum values of the film thickness h of the main electrode layer and the cut angle θ in which the magnitude of spurious response is about 0.5 dB or less, when the film thickness H of the dielectric film is about 0.250λ. In FIG. 21, X-shaped plots indicate the maximum value of the film thickness h of the main electrode layer, and circular plots indicate the minimum value of the film thickness h of the main electrode layer.

It is understood that the maximum and minimum values of the film thickness of the main electrode layer with which the magnitude of the spurious response is about 0.5 dB or less depend on the cut angle θ as shown in FIG. 21. The maximum and minimum values may be expressed by the following equations:

Minimum value: $h/\lambda = 2 \times \exp(-0.24 \times (\theta + 10.8)) + 0.085$;

and

Maximum value: $h/\lambda = 2 \times \exp(-0.243 \times (\theta + 6.3)) + 0.092$ Thus, when the film thickness H of the dielectric film is about 0.250λ, the conditions under which the magnitude of the spurious response is about 0.5 dB or less are expressed by the following formulae:

$H=0.250\lambda$:

$2\times\exp(-0.24\times(\theta+10.8))+0.085 \le h/\lambda \le 2\times\exp(-0.243\times(\theta+6.3))+0.092$.

Similarly, when the film thickness H of the dielectric film is other than about 0.250λ, the conditions under which the magnitude of the spurious response is about 0.5 dB or less are expressed by the following formulae:

$H=0.200\lambda$:

$2\times\exp(-0.245\times(\theta+10.8))+0.0885 \le h/\lambda \le 2\exp(-0.25\times(\theta+6.3))+0.0955$;

$H=0.225\lambda$:

$2\times\exp(-0.2425\times(\theta+10.8))+0.087 \le h/\lambda \le 2\exp(-0.247\times(\theta+6.3))+0.0942$;

$H=0.275\lambda$:

$2\times\exp(-0.2375\times(\theta+10.8))+0.0826 \le h/\lambda \le 2\exp(-0.24\times(\theta+6.3))+0.0881$;

$H=0.300\lambda$:

$2\times\exp(-0.235\times(\theta+10.8))+0.08 \le h/\lambda \le 2\times\exp(-0.236\times(\theta+6.3))+0.0848$;

$H=0.325\lambda$:

$2\times\exp(-0.2325\times(\theta+10.8))+0.077 \le h/\lambda \le 2\exp(-0.232\times(\theta+6.3))+0.0799$; and $H=0.350\lambda$:

$2\times\exp(-0.23\times(\theta+10.8))+0.0735 \le h/\lambda \le 2\times\exp(-0.227\times(\theta+6.3))+0.0757$.

The conditions under which the magnitude of the spurious response is about 0.5 dB or less are summarized and expressed by Formula (1) below:

$2\times\exp(-A\times(\theta+10.8))+B \le h/\lambda \le 2\times\exp(-C\times(\theta+6.3))+D$     Formula (1).

The coefficients A, B, C and D in Formula (1) are listed in Table 2. The relationships between the coefficients above and the film thickness H of the dielectric film are shown in FIG. 22 to FIG. 25, respectively.

TABLE 2

| MAIN COMPONENT OF MAIN ELECTRODE LAYER | FILM THICKNESS H OF DIELECTRIC FILM (SiO$_2$) | A | B | C | D |
|---|---|---|---|---|---|
| Pt | 0.200 | 0.245 | 0.0885 | 0.25 | 0.0955 |
|  | 0.225 | 0.2425 | 0.087 | 0.247 | 0.0942 |
|  | 0.250 | 0.24 | 0.085 | 0.243 | 0.092 |
|  | 0.275 | 0.2375 | 0.0826 | 0.24 | 0.0881 |
|  | 0.300 | 0.235 | 0.08 | 0.236 | 0.0848 |
|  | 0.325 | 0.2325 | 0.077 | 0.232 | 0.0799 |
|  | 0.350 | 0.23 | 0.0735 | 0.227 | 0.0757 |

Figure 22:
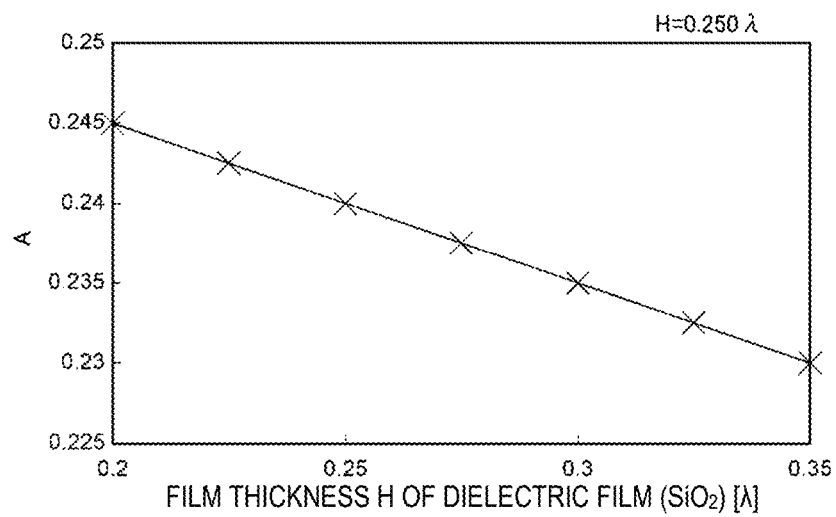
FIG. 22 is a graph of the relationship between a coefficient A and the film thickness H of the dielectric film in the formula expressing the condition under which the magnitude of the spurious response is about 0.5 dB or less.
Figure 23:
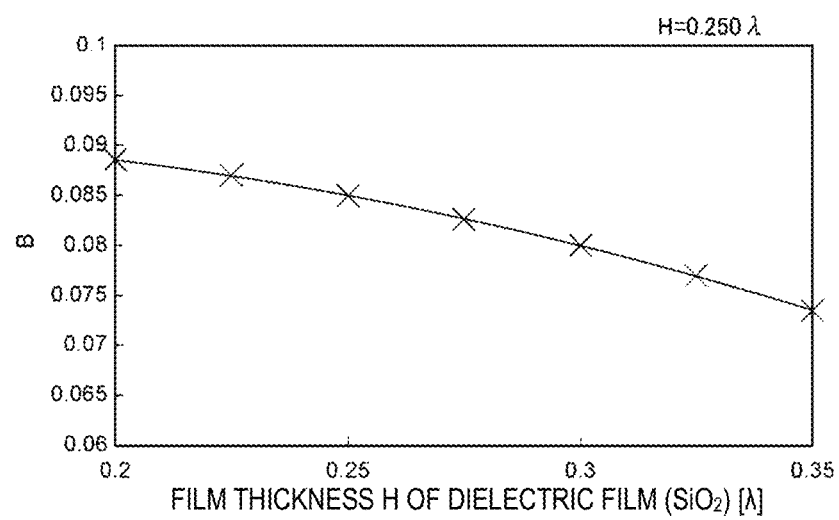
FIG. 23 is a graph of the relationship between a coefficient B and the film thickness H of the dielectric film in the formula expressing the condition under which the magnitude of the spurious response is about 0.5 dB or less.
Figure 24:
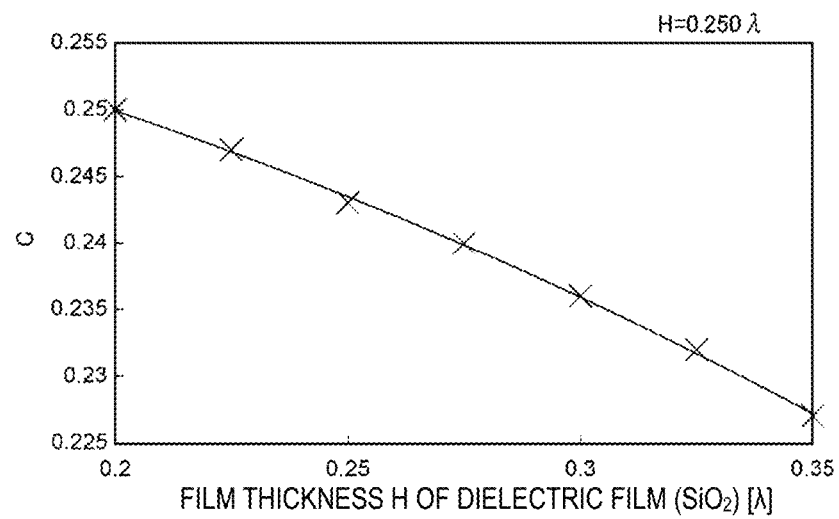
FIG. 24 is a graph of the relationship between a coefficient C and the film thickness H of the dielectric film in the formula expressing the condition under which the magnitude of the spurious response is about 0.5 dB or less.
Figure 25:
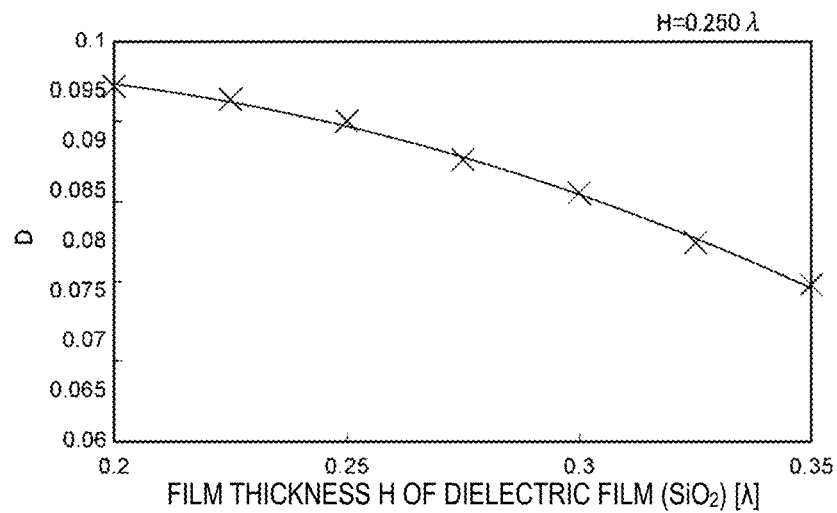
FIG. 25 is a graph of the relationship between a coefficient D and the film thickness H of the dielectric film in the formula expressing the condition under which the magnitude of the spurious response is about 0.5 dB or less.

FIG. 22 is a graph of the relationship between the coefficient A and the film thickness H of the dielectric film in the formula expressing the condition under which the magnitude of the spurious response is about 0.5 dB or less. FIG. 23 is a graph of the relationship between the coefficient B and the film thickness H of the dielectric film in the formula expressing the condition under which the magnitude of the spurious response is about 0.5 dB or less. FIG. 24 is a graph of the relationship between the coefficient C and the film thickness H of the dielectric film in the formula expressing the condition under which the magnitude of the spurious response is about 0.5 dB or less. FIG. 25 is a graph of the relationship between the coefficient D and the film thickness H of the dielectric film in the formula expressing the condition under which the magnitude of the spurious response is about 0.5 dB or less.

It is understood that the coefficients A to D depend on the film thickness H of the dielectric film as shown in FIG. 22 to FIG. 25, respectively. The relationships between the coefficients A to D and the film thickness H of the dielectric film are expressed by Equation (2A) to Equation (2D) below, respectively:

$A=-0.1\times(H/\lambda)+0.265$     Equation (2A);

$B=-0.2933\times(H/\lambda)^2+0.0613\times(H/\lambda)+0.088$     Equation (2B);

$C=-0.2286\times(H/\lambda)^2-0.0257\times(H/\lambda)+0.2642$     Equation (2C); and $D=-0.5105\times(H/\lambda)^2+0.1448\times(H/\lambda)+0.0872$     Equation (2D).

The relationship in Formula (1) and Equation (2A) to Equation (2D) is satisfied in the present preferred embodiment, and this makes it possible to effectively reduce or prevent unnecessary waves.

It has been known that, in a device including a surface acoustic wave, electric power handling capability and linearity are likely to deteriorate when a large stress is applied to an auxiliary conductive layer such as an Al layer in an IDT electrode. Whereas, in the present preferred embodiment, the main electrode layer 3a having a relatively high density is, compared to the auxiliary conductive layer 3b having a relatively low density, closer to the side of the piezoelectric substrate 2 as illustrated in FIG. 3. With this, a stress applied to the auxiliary conductive layer 3b may be reduced. Accordingly, the surface acoustic wave device 1 has excellent electric power handling capability and linearity. This will be described below by comparing the present preferred embodiment and the comparative example. In the comparative example, the auxiliary conductive layer is, compared to the main electrode layer, closer to the side of the piezoelectric substrate.

Figure 26:
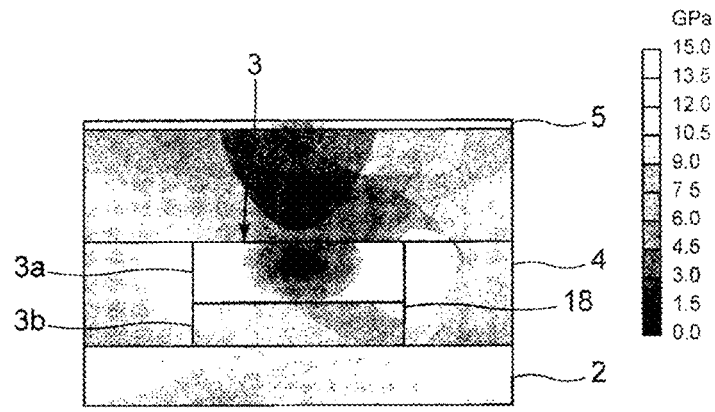
FIG. 26 is a chart of the magnitude of a stress (equivalent stress of von Mises) obtained by a finite element method, the stress being applied to an electrode finger of an IDT electrode when a signal, having a resonant frequency of a one-port resonator with a certain constant electric power, is applied to the IDT electrode having the structure of a comparative example.
Figure 27:
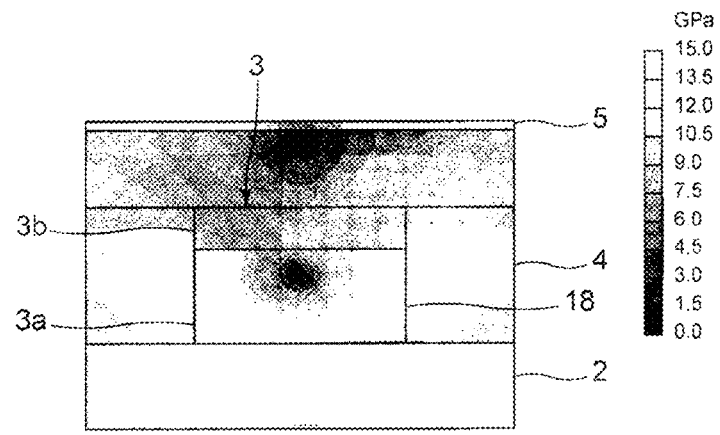
FIG. 27 is a chart of the magnitude of a stress applied to the electrode finger of the IDT electrode when a signal, having a resonant frequency of a one-port resonator with a certain constant electric power, is applied to the IDT electrode having the structure of the first preferred embodiment of the present invention.

FIG. 26 is a chart of the magnitude of the stress (equivalent stress of von Mises) obtained by a finite element method, the stress being applied to the electrode finger of the IDT electrode when a signal, having a resonant frequency of a one-port resonator with a certain constant electric power, is applied to the IDT electrode having the structure of the comparative example. FIG. 27 is a chart of the magnitude of the stress applied to the electrode finger of the IDT electrode when a signal, having a resonant frequency of a one-port resonator with a certain constant electric power, is applied to the IDT electrode having the structure of the first preferred embodiment.

As illustrated in FIG. 26, in the comparative example, the large stress of about 10.5 GPa or more is applied in most of the auxiliary conductive layer 3b. Whereas, as illustrated in FIG. 27, in the present preferred embodiment, the stress applied is about 7.5 GPa or less in most of the auxiliary conductive layer 3b. As described above, it is understood that the stress applied is suppressed in most of the auxiliary conductive layer 3b. That is, in the present preferred embodiment, arranging the main electrode layer 3a, compared to the auxiliary conductive layer 3b, closer to the side of the piezoelectric substrate 2 makes it possible to reduce or prevent the stress applied to the auxiliary conductive layer 3b. Accordingly, it is possible to reduce or prevent the deterioration of the electric power handling capability and linearity.

In addition, since the main electrode layer 3a is relatively thick, the acoustic velocity of the excited surface acoustic wave may be reduced. Here, when the acoustic velocity is denoted as V and the frequency is denoted as f, V=fλ is satisfied. When the frequency f of the surface acoustic wave used in the surface acoustic wave device 1 is constant or substantially constant, the value of the wavelength λ decreases as the thickness of the IDT electrode 3 increases and the value of the acoustic velocity V decreases. Thus, the electrode finger pitch of the IDT electrode 3 may be reduced. Accordingly, the surface acoustic wave device 1 may be reduced in size in the present preferred embodiment.

The film thickness of the main electrode layer 3a is preferably about 0.06, or more, and more preferably about 0.08, or more, for example. With this, the acoustic velocity of the surface acoustic wave may be effectively reduced, and the reduction in size of the surface acoustic wave device 1 may be effectively achieved. The film thickness of the auxiliary conductive layer 3b is preferably about 0.04, or more, and more preferably about 0.10λ or more, for example. With this, the resistance of the IDT electrode may be effectively reduced, and the loss of the device may be reduced. The film thickness of the IDT electrode 3 is preferably about 0.10λ or more, and more preferably about 0.18λ or more, for example. Whereas, providing the IDT electrode 3 that is excessively thick may make it difficult to provide an electrode pattern. Thus, the film thickness of the IDT electrode 3 is preferably about 0.25λ or less, for example.

The film thickness of the dielectric film 4 is preferably about 0.12λ or more, and more preferably about 0.20λ or more, for example. With this, even when the film thickness of the IDT electrode 3 is within the above-described preferred range, the IDT electrode 3 may be covered with the dielectric film 4. Thus, the surface acoustic wave device 1 may more reliably be reduced in size. Whereas, forming the dielectric film 4 excessively thick may decrease the electromechanical coupling coefficient. Thus, the film thickness of the dielectric film 4 is preferably about 0.40, or less, for example.

For example, as shown in FIG. 17, as the cut angle θ of the θ° rotated Y-cut X-propagation LiNbO$_3$ used for the piezoelectric substrate 2 increases, the range of the film thickness of the main electrode layer 3a in which the spurious response decreases. Here, the cut angle θ is preferably about 30° or less, for example. With this, even when manufacturing variations occur in the cut angle θ, unnecessary waves may be more reliably reduced or prevented.

In the present description, the orientation of the LiNbO$_3$ used for the piezoelectric substrate 2 is described as θ° rotated Y-cut X-propagation. This is expressed as (0°, θ−90°, 0°) by Euler angles. Here, the first and third Euler angles of 0° may be within the range of about −5° or more and about 5° or less, for example. Here, even when the direction of the crystal axis of the LiNbO$_3$ used for the piezoelectric substrate 2 is opposite, electrical characteristics are the same. Thus, the piezoelectric substrate 2 may use LiNbO$_3$ having Euler angles (0°, θ+90°, 0°). The case above is expressed as (θ−180°) rotated Y-cut X-propagation in terms of the cut angle.

As described above, the IDT electrode 3 may include an adhesive layer or a diffusion prevention layer, for example, in addition to the main electrode layer 3a and the auxiliary conductive layer 3b. The adhesive layer and the diffusion prevention layer are preferably thinner than the main electrode layer 3a and the auxiliary conductive layer 3b. More specifically, the film thickness of each of the adhesive layer and the diffusion prevention layer is preferably about 0.020λ or less, for example. For example, Ti, Ni, Cr, NiCr, or the like may be used for the material of the adhesive layer and the diffusion prevention layer.

For the auxiliary conductive layer 3b, Al or an alloy including Al as a main component is preferably used. For the dielectric film 4, SiO$_2$ is preferably used. Al and SiO$_2$ have similar physical properties, such as density and elastic constant. Accordingly, in the case that the auxiliary conductive layer 3b including Al as a main component is covered with the dielectric film 4 made of SiO$_2$, even when the film thickness of the auxiliary conductive layer 3b varies, characteristics such as of spurious response are less likely to change. Accordingly, even when the film thickness of the auxiliary conductive layer 3b varies, the range of the film thickness of the main electrode layer 3a in which the spurious response is small is less likely to change. Thus, unnecessary waves may be more reliably reduced or prevented.

The main component of the main electrode layer of the IDT electrode according to preferred embodiments of the present invention is not limited to Pt. The main component of the main electrode layer may be Au or W, for example. Hereinafter, with reference to FIG. 3, a second preferred embodiment of the present invention in which the main component of the main electrode layer is Au and a third preferred embodiment of the present invention in which the main component of the main electrode layer is W will be described.

In the second preferred embodiment, the main electrode layer 3a having a relatively high density is, compared to the auxiliary conductive layer 3b having a relatively low density, closer to the side of the piezoelectric substrate. With this, the stress applied to the auxiliary conductive layer 3b may be reduced. Accordingly, the surface acoustic wave device according to the second preferred embodiment has excellent electric power handling capability and linearity as in the first preferred embodiment.

Here, in the second preferred embodiment, in the same or substantially the same manner as in the first preferred embodiment, conditions were obtained in which the spurious response may be reduced to about 0.5 dB or less. The conditions are listed in Table 3.

TABLE 3

| FILM THICKNESS H OF DIELECTRIC FILM (SiO$_2$) | θ | RANGE OF FILM THICKNESS h OF MAIN ELECTRODE LAYER (Au) |
| --- | --- | --- |
| 0.200λ | 2.5 | 0.1343 ≤ h/λ |
| | 5 | 0.1056 ≤ h/λ |
| | 7.5 | 0.0908 ≤ h/λ ≤ 0.1167 |
| | 10 | 0.0823 ≤ h/λ ≤ 0.0992 |
| | 12.5 | 0.0769 ≤ h/λ ≤ 0.0890 |
| | 15 | 0.0735 ≤ h/λ ≤ 0.0827 |
| | 17.5 | 0.0713 ≤ h/λ ≤ 0.0785 |
| | 20 | 0.0698 ≤ h/λ ≤ 0.0758 |
| | 22.5 | 0.0689 ≤ h/λ ≤ 0.0741 |
| | 25 | 0.0683 ≤ h/λ ≤ 0.0730 |
| | 27.5 | 0.0682 ≤ h/λ ≤ 0.0725 |
| | 30 | 0.0683 ≤ h/λ ≤ 0.0722 |

TABLE 3-continued

| FILM THICKNESS H OF DIELECTRIC FILM (SiO₂) | θ | RANGE OF FILM THICKNESS h OF MAIN ELECTRODE LAYER (Au) |
|---|---|---|
| 0.225λ | 2.5 | 0.1355 ≤ h/λ |
| | 5 | 0.1063 ≤ h/λ ≤ 0.1553 |
| | 7.5 | 0.0913 ≤ h/λ ≤ 0.1185 |
| | 10 | 0.0826 ≤ h/λ ≤ 0.1002 |
| | 12.5 | 0.0771 ≤ h/λ ≤ 0.0897 |
| | 15 | 0.0736 ≤ h/λ ≤ 0.0830 |
| | 17.5 | 0.0712 ≤ h/λ ≤ 0.0787 |
| | 20 | 0.0697 ≤ h/λ ≤ 0.0759 |
| | 22.5 | 0.0687 ≤ h/λ ≤ 0.0740 |
| | 25 | 0.0681 ≤ h/λ ≤ 0.0728 |
| | 27.5 | 0.0679 ≤ h/λ ≤ 0.0723 |
| | 30 | 0.0679 ≤ h/λ ≤ 0.0720 |
| 0.250λ | 2.5 | 0.1362 ≤ h/λ |
| | 5 | 0.1066 ≤ h/λ ≤ 0.1587 |
| | 7.5 | 0.0913 ≤ h/λ ≤ 0.1196 |
| | 10 | 0.0824 ≤ h/λ ≤ 0.1006 |
| | 12.5 | 0.0768 ≤ h/λ ≤ 0.0897 |
| | 15 | 0.0732 ≤ h/λ ≤ 0.0829 |
| | 17.5 | 0.0708 ≤ h/λ ≤ 0.0784 |
| | 20 | 0.0691 ≤ h/λ ≤ 0.0754 |
| | 22.5 | 0.0680 ≤ h/λ ≤ 0.0734 |
| | 25 | 0.0675 ≤ h/λ ≤ 0.0722 |
| | 27.5 | 0.0672 ≤ h/λ ≤ 0.0714 |
| | 30 | 0.0671 ≤ h/λ ≤ 0.0711 |
| 0.275λ | 2.5 | 0.1366 ≤ h/λ ≤ |
| | 5 | 0.1065 ≤ h/λ ≤ 0.1613 |
| | 7.5 | 0.0910 ≤ h/λ ≤ 0.1202 |
| | 10 | 0.0820 ≤ h/λ ≤ 0.1006 |
| | 12.5 | 0.0763 ≤ h/λ ≤ 0.0894 |
| | 15 | 0.0726 ≤ h/λ ≤ 0.0823 |
| | 17.5 | 0.0699 ≤ h/λ ≤ 0.0776 |
| | 20 | 0.0683 ≤ h/λ ≤ 0.0746 |
| | 22.5 | 0.0672 ≤ h/λ ≤ 0.0725 |
| | 25 | 0.0663 ≤ h/λ ≤ 0.0711 |
| | 27.5 | 0.0660 ≤ h/λ ≤ 0.0703 |
| | 30 | 0.0659 ≤ h/λ ≤ 0.0698 |
| 0.300λ | 2.5 | 0.1365 ≤ h/λ |
| | 5 | 0.1062 ≤ h/λ ≤ 0.1631 |
| | 7.5 | 0.0905 ≤ h/λ ≤ 0.1204 |
| | 10 | 0.0813 ≤ h/λ ≤ 0.1003 |
| | 12.5 | 0.0755 ≤ h/λ ≤ 0.0888 |
| | 15 | 0.0716 ≤ h/λ ≤ 0.0815 |
| | 17.5 | 0.0690 ≤ h/λ ≤ 0.0767 |
| | 20 | 0.0672 ≤ h/λ ≤ 0.0735 |
| | 22.5 | 0.0659 ≤ h/λ ≤ 0.0713 |
| | 25 | 0.0652 ≤ h/λ ≤ 0.0698 |
| | 27.5 | 0.0647 ≤ h/λ ≤ 0.0689 |
| | 30 | 0.0645 ≤ h/λ ≤ 0.0683 |
| 0.325λ | 2.5 | 0.1362 ≤ h/λ |
| | 5 | 0.1058 ≤ h/λ ≤ 0.1642 |
| | 7.5 | 0.0899 ≤ h/λ ≤ 0.1204 |
| | 10 | 0.0805 ≤ h/λ ≤ 0.0999 |
| | 12.5 | 0.0745 ≤ h/λ ≤ 0.0880 |
| | 15 | 0.0707 ≤ h/λ ≤ 0.0805 |
| | 17.5 | 0.0679 ≤ h/λ ≤ 0.0756 |
| | 20 | 0.0660 ≤ h/λ ≤ 0.0723 |
| | 22.5 | 0.0648 ≤ h/λ ≤ 0.0700 |
| | 25 | 0.0639 ≤ h/λ ≤ 0.0684 |
| | 27.5 | 0.0633 ≤ h/λ ≤ 0.0674 |
| | 30 | 0.0630 ≤ h/λ ≤ 0.0668 |
| 0.350λ | 2.5 | 0.1360 ≤ h/λ |
| | 5 | 0.1053 ≤ h/λ ≤ 0.1649 |
| | 7.5 | 0.0892 ≤ h/λ ≤ 0.1203 |
| | 10 | 0.0796 ≤ h/λ ≤ 0.0993 |
| | 12.5 | 0.0736 ≤ h/λ ≤ 0.0872 |
| | 15 | 0.0695 ≤ h/λ ≤ 0.0795 |
| | 17.5 | 0.0668 ≤ h/λ ≤ 0.0745 |
| | 20 | 0.0648 ≤ h/λ ≤ 0.0710 |
| | 22.5 | 0.0635 ≤ h/λ ≤ 0.0686 |
| | 25 | 0.0625 ≤ h/λ ≤ 0.0671 |
| | 27.5 | 0.0619 ≤ h/λ ≤ 0.0659 |
| | 30 | 0.0616 ≤ h/λ ≤ 0.0652 |

The maximum and minimum values of the film thickness of the main electrode layer 3a with which the magnitude of the spurious response is about 0.5 dB or less may be expressed by the following equations:

$$\text{Maximum value: } h/\lambda = 2 \times \exp(-0.1988 \times (\theta+14.6)) + 0.0668; \text{ and}$$

$$\text{Minimum value: } h/\lambda = 2 \times \exp(-0.219 \times (\theta+9.3)) + 0.072.$$

Thus, for each film thickness H of the dielectric film, the conditions under which the magnitude of the spurious response is about 0.5 dB or less are expressed by the following formulae:

$H=0.200\lambda$:

$$2 \times \exp(-0.2 \times (\theta+14.6))+0.0678 \leq h/\lambda \leq 2 \times \exp(-0.225 \times (\theta+9.3))+0.0735;$$

$H=0.225\lambda$:

$$2 \times \exp(-0.1995 \times (\theta+14.6))+0.0672 \leq h/\lambda \leq 2 \times \exp(-0.222 \times (\theta+9.3))+0.073;$$

$H=0.250\lambda$:

$$2 \times \exp(-0.1988 \times (\theta+14.6))+0.0668 \leq h/\lambda \leq 2 \times \exp(-0.219 \times (\theta+9.3))+0.072;$$

$H=0.275\lambda$:

$$2 \times \exp(-0.198 \times (\theta+14.6))+0.0662 \leq h/\lambda \leq 2 \times \exp(-0.216 \times (\theta+9.3))+0.0708;$$

$H=0.300\lambda$:

$$2 \times \exp(-0.197 \times (\theta+14.6))+0.0655 \leq h/\lambda \leq 2 \times \exp(-0.213 \times (\theta+9.3))+0.069;$$

$H=0.325\lambda$:

$$2 \times \exp(-0.1957 \times (\theta+14.6))+0.0648 \leq h/\lambda \leq 2 \times \exp(-0.21 \times (\theta+9.3))+0.0668; \text{ and}$$

$H=0.350\lambda$:

$$2 \times \exp(-0.1942 \times (\theta+14.6))++0.064 \leq h/\lambda \leq 2 \times \exp(-0.207 \times (\theta+9.3))+0.0644.$$

The conditions under which the magnitude of the spurious response is about 0.5 dB or less are summarized and expressed by Formula (3) below:

$$2 \times \exp(-A \times (\theta+14.6))+B \leq h/\lambda \leq 2 \times \exp(-C \times (\theta+9.3))+D \quad \text{Formula (3)}.$$

The coefficients A, B, C and D in Formula (3) are listed in Table 4. The relationships between the coefficients A to D and the film thickness H of the dielectric film are expressed by Equation (4A) to Equation (4D) below, respectively.

TABLE 4

| MAIN COMPONENT OF MAIN ELECTRODE LAYER | FILM THICKNESS H OF DIELECTRIC FILM (SiO₂) | A | B | C | D |
|---|---|---|---|---|---|
| Au | 0.200 | 0.2 | 0.0678 | 0.225 | 0.0735 |
| | 0.225 | 0.1995 | 0.0672 | 0.222 | 0.073 |
| | 0.250 | 0.1988 | 0.0668 | 0.219 | 0.072 |

TABLE 4-continued

| MAIN COMPONENT OF MAIN ELECTRODE LAYER | FILM THICKNESS H OF DIELECTRIC FILM (SiO$_2$) | A | B | C | D |
|---|---|---|---|---|---|
| | 0.275 | 0.198 | 0.0662 | 0.216 | 0.0708 |
| | 0.300 | 0.197 | 0.0655 | 0.213 | 0.069 |
| | 0.325 | 0.1957 | 0.0648 | 0.21 | 0.0668 |
| | 0.350 | 0.1942 | 0.064 | 0.207 | 0.0644 |

$$A = -0.16 \times (H/\lambda)^2 - 0.0497 \times (H/\lambda) + 0.1964 \quad \text{Equation (4A);}$$

$$B = -0.0514 \times (H/\lambda)^2 + 0.0033 \times (H/\lambda) + 0.0692 \quad \text{Equation (4B);}$$

$$C = -0.12 \times (H/\lambda) + 0.249 \quad \text{Equation (4C); and}$$

$$D = -0.3181 \times (H/\lambda)^2 + 0.114 \times (H/\lambda) + 0.0634 \quad \text{Equation (4D).}$$

In the present preferred embodiment, the relationship in Formula (3) and Equation (4A) to Equation (4D) is satisfied. In addition, as described above, the main electrode layer 3a having a relatively high density is, compared to the auxiliary conductive layer 3b having a relatively low density, closer to the side of the piezoelectric substrate 2. Accordingly, the surface acoustic wave device according to the second preferred embodiment has excellent electric power handling capability and linearity and may effectively reduce or prevent unnecessary waves.

Hereinafter, the third preferred embodiment in which the main component of the main electrode layer is W will be described with reference to FIG. 3. In the third preferred embodiment, the main electrode layer 3a having a relatively high density is, compared to the auxiliary conductive layer 3b having a relatively low density, closer to the side of the piezoelectric substrate. With this, the stress applied to the auxiliary conductive layer 3b may be reduced. Accordingly, the surface acoustic wave device according to the third preferred embodiment has excellent electric power handling capability and linearity as in the first preferred embodiment.

Here, in the same or substantially the same manner as in the first preferred embodiment, obtained were conditions under which the spurious response may be reduced to about 0.5 dB or less. The conditions are listed in Table 5.

TABLE 5

| FILM THICKNESS H OF DIELECTRIC FILM (SiO$_2$) | θ | RANGE OF FILM THICKNESS h OF MAIN ELECTRODE LAYER (W) |
|---|---|---|
| 0.200λ | 10 | 0.1443 ≤ h/λ |
| | 12.5 | 0.1371 ≤ h/λ |
| | 15 | 0.1327 ≤ h/λ |
| | 17.5 | 0.1304 ≤ h/λ |
| | 20 | 0.1294 ≤ h/λ |
| | 22.5 | 0.1295 ≤ h/λ |
| | 25 | 0.1306 ≤ h/λ ≤ 0.1441 |
| | 27.5 | 0.1322 ≤ h/λ ≤ 0.1446 |
| | 30 | 0.1345 ≤ h/λ ≤ 0.1460 |
| 0.225λ | 10 | 0.1484 ≤ h/λ |
| | 12.5 | 0.1402 ≤ h/λ |
| | 15 | 0.1353 ≤ h/λ ≤ 0.1630 |
| | 17.5 | 0.1325 ≤ h/λ ≤ 0.1560 |
| | 20 | 0.1314 ≤ h/λ ≤ 0.1518 |
| | 22.5 | 0.1315 ≤ h/λ ≤ 0.1496 |
| | 25 | 0.1326 ≤ h/λ ≤ 0.1490 |
| | 27.5 | 0.1346 ≤ h/λ ≤ 0.1497 |
| | 30 | 0.1373 ≤ h/λ ≤ 0.1516 |
| 0.250λ | 5 | 0.1906 ≤ h/λ |
| | 7.5 | 0.1649 ≤ h/λ |
| | 10 | 0.1495 ≤ h/λ |
| | 12.5 | 0.1403 ≤ h/λ ≤ 0.1804 |
| | 15 | 0.1346 ≤ h/λ ≤ 0.1669 |
| | 17.5 | 0.1314 ≤ h/λ ≤ 0.1584 |
| | 20 | 0.1299 ≤ h/λ ≤ 0.1532 |
| | 22.5 | 0.1298 ≤ h/λ ≤ 0.1504 |
| | 25 | 0.1307 ≤ h/λ ≤ 0.1496 |
| | 27.5 | 0.1327 ≤ h/λ ≤ 0.1502 |
| | 30 | 0.1355 ≤ h/λ ≤ 0.1522 |
| 0.275λ | 5 | 0.1942 ≤ h/λ |
| | 7.5 | 0.1648 ≤ h/λ |
| | 10 | 0.1476 ≤ h/λ ≤ 0.2084 |
| | 12.5 | 0.1374 ≤ h/λ ≤ 0.1828 |
| | 15 | 0.1311 ≤ h/λ ≤ 0.1663 |
| | 17.5 | 0.1274 ≤ h/λ ≤ 0.1559 |
| | 20 | 0.1256 ≤ h/λ ≤ 0.1495 |
| | 22.5 | 0.1248 ≤ h/λ ≤ 0.1461 |
| | 25 | 0.1254 ≤ h/λ ≤ 0.1446 |
| | 27.5 | 0.1268 ≤ h/λ ≤ 0.1448 |
| | 30 | 0.1291 ≤ h/λ ≤ 0.1466 |
| 0.300λ | 5 | 0.1944 ≤ h/λ |
| | 7.5 | 0.1617 ≤ h/λ |
| | 10 | 0.1434 ≤ h/λ ≤ 0.2117 |
| | 12.5 | 0.1325 ≤ h/λ ≤ 0.1797 |
| | 15 | 0.1260 ≤ h/λ ≤ 0.1606 |
| | 17.5 | 0.1219 ≤ h/λ ≤ 0.1492 |
| | 20 | 0.1194 ≤ h/λ ≤ 0.1422 |
| | 22.5 | 0.1183 ≤ h/λ ≤ 0.1381 |
| | 25 | 0.1183 ≤ h/λ ≤ 0.1359 |
| | 27.5 | 0.1191 ≤ h/λ ≤ 0.1354 |
| | 30 | 0.1206 ≤ h/λ ≤ 0.1362 |
| 0.325λ | 5 | 0.1912 ≤ h/λ |
| | 7.5 | 0.1567 ≤ h/λ |
| | 10 | 0.1380 ≤ h/λ ≤ 0.2083 |
| | 12.5 | 0.1270 ≤ h/λ ≤ 0.1718 |
| | 15 | 0.1203 ≤ h/λ ≤ 0.1522 |
| | 17.5 | 0.1159 ≤ h/λ ≤ 0.1406 |
| | 20 | 0.1131 ≤ h/λ ≤ 0.1335 |
| | 22.5 | 0.1116 ≤ h/λ ≤ 0.1291 |
| | 25 | 0.1112 ≤ h/λ ≤ 0.1266 |
| | 27.5 | 0.1114 ≤ h/λ ≤ 0.1255 |
| | 30 | 0.1122 ≤ h/λ ≤ 0.1256 |
| 0.350λ | 5 | 0.1858 ≤ h/λ |
| | 7.5 | 0.1513 ≤ h/λ |
| | 10 | 0.1327 ≤ h/λ ≤ 0.1987 |
| | 12.5 | 0.1217 ≤ h/λ ≤ 0.1625 |
| | 15 | 0.1146 ≤ h/λ ≤ 0.1437 |
| | 17.5 | 0.1102 ≤ h/λ ≤ 0.1325 |
| | 20 | 0.1073 ≤ h/λ ≤ 0.1255 |
| | 22.5 | 0.1056 ≤ h/λ ≤ 0.1211 |
| | 25 | 0.1048 ≤ h/λ ≤ 0.1183 |
| | 27.5 | 0.1046 ≤ h/λ ≤ 0.1167 |
| | 30 | 0.1049 ≤ h/λ ≤ 0.1164 |

The maximum and minimum values of the film thickness of the main electrode layer 3a with which the magnitude of the spurious response is about 0.5 dB or less may be expressed by the following equations:

Maximum value: $h/\lambda = 2 \times \exp(-0.194 \times (\theta + 13.1)) + 0.1263$; and Minimum value: $h/\lambda = 2 \times \exp(-0.225 \times (\theta + 6)) + 0.147$.

Thus, for each film thickness H of the dielectric film, the conditions under which the magnitude of the spurious response is about 0.5 dB or less are expressed by the following formulae:

$H = 0.200\lambda$:

$$2 \times \exp(-0.2135 \times (\theta + 13.1)) + 0.129 \leq h/\lambda \leq 2 \times \exp(-0.26 \times (\theta + 6)) + 0.146;$$

$H=0.225\lambda$:

$2\times\exp(-0.203\times(\theta+13.1))+0.1285 \leq h/\lambda \leq 2\times\exp(-0.24\times(\theta+6))+0.15$;

$H=0.250\lambda$:

$2\times\exp(-0.194\times(\theta+13.1))+0.1263 \leq h/\lambda \leq 2\times\exp(-0.225\times(\theta+6))+0.147$;

$H=0.275\lambda$:

$2\times\exp(-0.187\times(\theta+13.1))+0.1221 \leq h/\lambda \leq 2\times\exp(-0.21\times(\theta+6))+0.141$;

$H=0.300\lambda$:

$2\times\exp(-0.181\times(\theta+13.1))+0.1149 \leq h/\lambda \leq 2\times\exp(-0.201\times(\theta+6))+0.133$;

$H=0.325\lambda$:

$2\times\exp(-0.176\times(\theta+13.1))+0.108 \leq h/\lambda \leq 2\times\exp(-0.198\times(\theta+6))+0.124$; and $H=0.350\lambda$:

$2\times\exp(-0.173\times(\theta+13.1))+0.1 \leq h/\lambda \leq 2\times\exp(-0.2\times(\theta+6))+0.144$.

The conditions under which the magnitude of the spurious response is about 0.5 dB or less are summarized and expressed by Formula (5) below:

$$2\times\exp(-A\times(\theta+13.1))+B \leq h/\lambda \leq 2\times\exp(-C\times(\theta+6))+D \quad \text{Formula (5)}.$$

The coefficients A, B, C and D in Formula (5) are listed in Table 6. The relationships between the coefficients A to D and the film thickness H of the dielectric film are expressed by Equation (6A) to Equation (6D) below, respectively.

TABLE 6

| MAIN COMPONENT OF MAIN ELECTRODE LAYER | FILM THICKNESS H OF DIELECTRIC FILM (SiO$_2$) | A | B | C | D |
| --- | --- | --- | --- | --- | --- |
| W | 0.200 | 0.2135 | 0.129 | 0.26 | 0.146 |
|   | 0.225 | 0.203 | 0.1285 | 0.24 | 0.15 |
|   | 0.250 | 0.194 | 0.1263 | 0.225 | 0.147 |
|   | 0.275 | 0.187 | 0.1221 | 0.21 | 0.141 |
|   | 0.300 | 0.181 | 0.1149 | 0.201 | 0.133 |
|   | 0.325 | 0.176 | 0.108 | 0.198 | 0.124 |
|   | 0.350 | 0.173 | 0.1 | 0.2 | 0.114 |

$A=1.1333\times(H/\lambda)^2-0.8926\times(H/\lambda)+0.3466$    Equation (6A);

$B=-1.2762\times(H/\lambda)^2+0.5028\times(H/\lambda)+0.0798$    Equation (6B);

$C=3.4667\times(H/\lambda)^2-2.3181\times(H/\lambda)+0.5858$    Equation (6C); and $D=-1.6\times(H/\lambda)^2+0.6314\times(H/\lambda)+0.0884$    Equation (6D).

In the present preferred embodiment, the relationship in Formula (5) and Equation (6A) to Equation (6D) is satisfied. In addition, as described above, the main electrode layer 3a having a relatively high density is, compared to the auxiliary conductive layer 3b having a relatively low density, closer to the side of the piezoelectric substrate 2. Accordingly, the surface acoustic wave device according to the third preferred embodiment has excellent electric power handling capability and linearity and may effectively reduce or prevent unnecessary waves.

Figure 28:
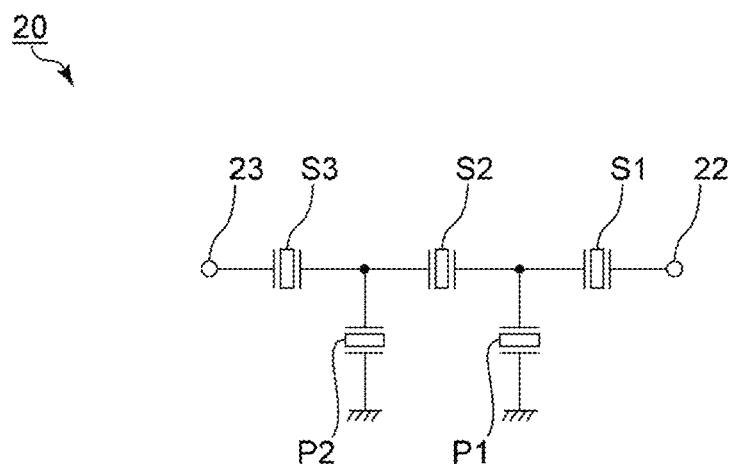
FIG. 28 is a circuit diagram of a filter device according to a fourth preferred embodiment of the present invention.

FIG. 28 is a circuit diagram of a filter device according to a fourth preferred embodiment of the present invention.

A filter device 20 is a ladder filter including a plurality of series arm resonators and a plurality of parallel arm resonators. More specifically, the filter device 20 includes a first signal terminal 22 and a second signal terminal 23. In the present preferred embodiment, the second signal terminal 23 is an antenna terminal connected to an antenna. The first signal terminal 22 and the second signal terminal 23 may be configured as electrode pads or may be configured as wiring lines.

A series arm resonator S1, a series arm resonator S2, and a series arm resonator S3 are connected in series with each other between the first signal terminal 22 and the second signal terminal 23. A parallel arm resonator P1 is connected between a ground potential and a node between the series arm resonator S1 and the series arm resonator S2. A parallel arm resonator P2 is connected between a ground potential and a node between the series arm resonator S2 and the series arm resonator S3.

Each of the parallel arm resonator P1 and the parallel arm resonator P2 has the configuration of the surface acoustic wave device according to any of the first to third preferred embodiments described above. Thus, the filter device 20 has excellent electric power handling capability and linearity, and it is possible to reduce or prevent unnecessary waves in the filter device 20.

The circuit configuration of the filter device 20 is not limited to the above-described configuration, and it is sufficient that at least one series arm resonator and at least one parallel arm resonator are included. It is sufficient that at least one parallel arm resonator in the filter device 20 has the configuration of a surface acoustic wave device according to a preferred embodiment of the present invention.

The anti-resonant frequency of the parallel arm resonator defining the pass band of the ladder filter is often positioned within the pass band of the ladder filter. As described above, in the surface acoustic wave device using the Love wave according to a preferred embodiment of the present application, the spurious response due to the Rayleigh wave occurs near the anti-resonant frequency. Accordingly, when the surface acoustic wave device using the Love wave is used for the parallel arm resonator, there is a possibility that a spurious response occurs in the pass band of the ladder filter, and the filter characteristics may deteriorate.

Whereas, in the present preferred embodiment in FIG. 28, the parallel arm resonator P1 and the parallel arm resonator P2 have the configuration of a surface acoustic wave device according to a preferred embodiment of the present invention. Thus, it is possible to reduce or prevent unnecessary waves in the pass band in the filter device 20. Accordingly, it is possible to reduce or prevent the deterioration of the filter characteristics.

As in the present preferred embodiment, all of the parallel arm resonators in the filter device 20 preferably have the configuration of a surface acoustic wave device according to a preferred embodiment of the present invention. With this, it is possible to further reduce or prevent the deterioration of the filter characteristics. Whereas, all of the series arm resonators and all of the parallel arm resonators may have the configuration of a surface acoustic wave device according to a preferred embodiment of the present invention.

In the present preferred embodiment, the resonator, electrically connected to the parallel arm resonator that is a surface acoustic wave device having the configuration according to a preferred embodiment of the present invention, is the series arm resonator. Whereas, the resonator, electrically connected to the parallel arm resonator, may be, for example, a longitudinally coupled resonator surface acoustic wave filter.

Figure 29:
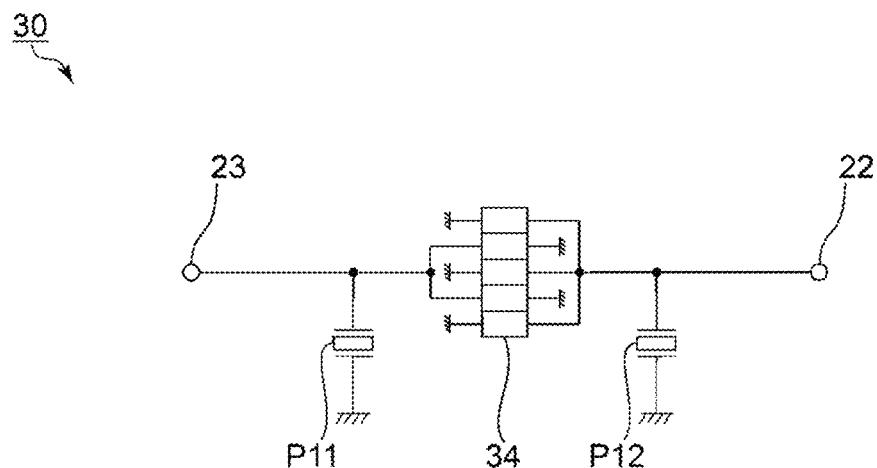
FIG. 29 is a circuit diagram of a filter device according to a fifth preferred embodiment of the present invention.

FIG. 29 is a circuit diagram of a filter device according to a fifth preferred embodiment of the present invention.

A filter device 30 includes a longitudinally coupled resonator surface acoustic wave filter 34, a parallel arm resonator P11, and a parallel arm resonator P12. The longitudinally coupled resonator surface acoustic wave filter 34 is connected between the first signal terminal 22 and the second signal terminal 23. The longitudinally coupled resonator surface acoustic wave filter 34 is, for example, a 5 IDT type longitudinally coupled resonator surface acoustic wave filter. Whereas, the longitudinally coupled resonator surface acoustic wave filter 34 may be a 3 IDT type or a 7 IDT type, for example, and the number of IDT electrodes in the longitudinally coupled resonator surface acoustic wave filter 34 is not particularly limited.

The parallel arm resonator P11 is connected between a ground potential and a node between the second signal terminal 23 and the longitudinally coupled resonator surface acoustic wave filter 34. The parallel arm resonator P12 is connected between the ground potential and a node between the first signal terminal 22 and the longitudinally coupled resonator surface acoustic wave filter 34. In the present preferred embodiment, the parallel arm resonator P11 and the parallel arm resonator P12 are used as parallel traps.

The parallel arm resonator P11 and the parallel arm resonator P12 have the configuration of a surface acoustic wave device according to any of the first to third preferred embodiments described above. Thus, the filter device 30 has excellent electric power handling capability and linearity, and it is possible to reduce or prevent unnecessary waves in the filter device 30.

The circuit configuration of the filter device 30 is not limited to the above-described configuration. It is sufficient that the filter device 30 includes the longitudinally coupled resonator surface acoustic wave filter 34 and at least one parallel arm resonator, and that the at least one parallel arm resonator has the configuration of a surface acoustic wave device according to a preferred embodiment of the present invention.

In the fourth and fifth preferred embodiments, a band pass filter is described as an example of the filter device. The filter device according to the present invention may be, for example, a duplexer or a multiplexer including a band pass filter having the configuration of the fourth or fifth preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device, comprising:
a piezoelectric substrate made of $\theta°$ rotated Y-cut X-propagation $LiNbO_3$ having a cut angle $\theta$;
an IDT electrode on the piezoelectric substrate and including a plurality of electrode fingers; and
a dielectric film on the piezoelectric substrate and covering the IDT electrode; wherein
the IDT electrode includes a main electrode layer and an auxiliary conductive layer;
the main electrode layer is, compared to the auxiliary conductive layer, closer to a side of the piezoelectric substrate;
the main electrode layer includes Pt as a main component; and
a relationship in Formula (1) and Equations (2A) to (2D) below is satisfied, where a film thickness of the main electrode layer is denoted as h, a film thickness of the dielectric film is denoted as H, and a wavelength determined by an electrode finger pitch of the IDT electrode is denoted as $\lambda$:

$2 \times \exp(-A \times (\theta+10.8)) + B \leq h/\lambda \leq 2 \times \exp(-C \times (\theta+6.3)) + D$  Formula (1);

$A = -0.1 \times (H/\lambda) + 0.265$  Equation (2A);

$B = -0.2933 \times (H/\lambda)^2 + 0.0613 \times (H/\lambda) + 0.088$  Equation (2B);

$C = -0.2286 \times (H/\lambda)^2 - 0.0257 \times (H/\lambda) + 0.2642$  Equation (2C); and $D = -0.5105 \times (H/\lambda)^2 + 0.1448 \times (H/\lambda) + 0.0872$  Equation (2D).

2. A surface acoustic wave device, comprising:
a piezoelectric substrate made of $\theta°$ rotated Y-cut X-propagation $LiNbO_3$ having a cut angle $\theta$;
an IDT electrode on the piezoelectric substrate and including a plurality of electrode fingers; and
a dielectric film on the piezoelectric substrate and covering the IDT electrode; wherein
the IDT electrode includes a main electrode layer and an auxiliary conductive layer;
the main electrode layer is, compared to the auxiliary conductive layer, closer to a side of the piezoelectric substrate;
the main electrode layer includes Au as a main component; and
a relationship in Formula (3) and Equations (4A) to (4D) below is satisfied, where a film thickness of the main electrode layer is denoted as h, a film thickness of the dielectric film is denoted as H, and a wavelength determined by an electrode finger pitch of the IDT electrode is denoted as $\lambda$:

$2 \times \exp(-A \times (\theta+14.6)) + B \leq h/\lambda \leq 2 \times \exp(-C \times (\theta+9.3)) + D$  Formula (3);

$A = -0.16 \times (H/\lambda)^2 - 0.0497 \times (H/\lambda) + 0.1964$  Equation (4A);

$B = -0.0514 \times (H/\lambda)^2 + 0.0033 \times (H/\lambda) + 0.0692$  Equation (4B);

$C = -0.12 \times (H/\lambda) + 0.249$  Equation (4C); and $D = -0.3181 \times (H/\lambda)^2 + 0.114 \times (H/\lambda) + 0.0634$  Equation (4D).

3. A surface acoustic wave device, comprising:
a piezoelectric substrate made of $\theta°$ rotated Y-cut X-propagation $LiNbO_3$ having a cut angle $\theta$;
an IDT electrode on the piezoelectric substrate and including a plurality of electrode fingers; and
a dielectric film on the piezoelectric substrate and covering the IDT electrode; wherein
the IDT electrode includes a main electrode layer and an auxiliary conductive layer;
the main electrode layer is, compared to the auxiliary conductive layer, closer to a side of the piezoelectric substrate;
the main electrode layer includes W as a main component; and
a relationship in Formula (5) and Equations (6A) to (6D) below is satisfied, where a film thickness of the main electrode layer is denoted as h, a film thickness of the dielectric film is denoted as H, and a wavelength determined by an electrode finger pitch of the IDT electrode is denoted as $\lambda$:

$$2\times\exp(-A\times(\theta+13.1))+B \leq h/\lambda \leq 2\times\exp(-C\times(\theta+6))+D \quad \text{Formula (5)};$$

$$A=1.1333\times(H/\lambda)^2-0.8926\times(H/\lambda)+0.3466 \quad \text{Equation (6A)};$$

$$B=-1.2762\times(H/\lambda)^2+0.5028\times(H/\lambda)+0.0798 \quad \text{Equation (6B)};$$

$$C=3.4667\times(H/\lambda)^2-2.3181\times(H/\lambda)+0.5858 \quad \text{Equation (6C); and}$$

$$D=-1.6\times(H/\lambda)^2+0.6314\times(H/\lambda)+0.0884 \quad \text{Equation (6D)}.$$

4. The surface acoustic wave device according claim 1, wherein a Love wave is used.

5. A filter device, comprising:
a parallel arm resonator; and
a resonator electrically connected to the parallel arm resonator; wherein
the parallel arm resonator is the surface acoustic wave device according to claim 1.

6. The surface acoustic wave device according claim 2, wherein a Love wave is used.

7. The surface acoustic wave device according claim 3, wherein a Love wave is used.

8. A filter device, comprising:
a parallel arm resonator; and
a resonator electrically connected to the parallel arm resonator; wherein
the parallel arm resonator is the surface acoustic wave device according to claim 2.

9. A filter device, comprising:
a parallel arm resonator; and
a resonator electrically connected to the parallel arm resonator; wherein
the parallel arm resonator is the surface acoustic wave device according to claim 3.

\* \* \* \* \*